(12) United States Patent
Huck et al.

(10) Patent No.: US 11,340,320 B2
(45) Date of Patent: May 24, 2022

(54) MAGNETOMETER FOR MEASURING AN UNKNOWN EXTERNAL MAGNETIC FIELD

(71) Applicant: DANMARKS TEKNISKE UNIVERSITET, Kongens Lyngby (DK)

(72) Inventors: Alexander Huck, Allerød (DK); Sepehr Ahmadi, Copenhagen N (DK); Haitham A. R. El-Ella, Malmö (SE); Ulrik Lund Andersen, Virum (DK)

(73) Assignee: Danmarks Tekniske Universitet, Kongens Lyngby (DK)

( * ) Notice: Subject to any disclaimer, the term of this patent is extended or adjusted under 35 U.S.C. 154(b) by 0 days.

(21) Appl. No.: 16/626,259

(22) PCT Filed: Jun. 29, 2018

(86) PCT No.: PCT/EP2018/067643
§ 371 (c)(1),
(2) Date: Dec. 23, 2019

(87) PCT Pub. No.: WO2019/002576
PCT Pub. Date: Jan. 3, 2019

(65) Prior Publication Data
US 2020/0158798 A1    May 21, 2020

(30) Foreign Application Priority Data
Jun. 29, 2017   (EP) .................. 17178726.0

(51) Int. Cl.
*G01R 33/32* (2006.01)
*G01N 24/00* (2006.01)
*G01R 33/032* (2006.01)

(52) U.S. Cl.
CPC ......... *G01R 33/323* (2013.01); *G01N 24/006* (2013.01); *G01R 33/032* (2013.01)

(58) Field of Classification Search
CPC .. G01N 24/006; G01N 24/10; G01N 21/6428; G01R 33/032; G01R 33/26; G01R 33/323; G01R 33/60
See application file for complete search history.

(56) References Cited

U.S. PATENT DOCUMENTS

| 8,947,080 B2 | 2/2015 | Lukin et al. |
| 2010/0315079 A1 | 12/2010 | Lukin et al. |

(Continued)

FOREIGN PATENT DOCUMENTS

| WO | WO 2015/175047 A2 | 2/2015 |
| WO | WO 2016/126436 A1 | 8/2016 |

(Continued)

OTHER PUBLICATIONS

Ahmdi, Sepehr et al., "Pump-Enhanced Continuous-Wave Magnetometry Using Nitrogen-Vacancy Ensembles" Physical Review Applied, 2017, pp. 034001-1-034001-10, vol. 8.

(Continued)

*Primary Examiner* — Jay Patidar
(74) *Attorney, Agent, or Firm* — Knobbe Martens Olson & Bear LLP

(57) ABSTRACT

The present invention relates to a magnetometer (100) using optically detected magnetic resonance (ODMR), where a solid state material (10), such as diamond, with an ensemble of paramagnetic defects, such as nitrogen vacancies centers NV, is applied. An optical cavity (20) is optically excited by an irradiation laser (25) arranged therefore. A coupling structure (30) causes a microwave excitation ($\Omega$) of the paramagnetic defects, and a permanent magnetic field (40, B_C) causes a Zeeman splitting of the energy levels in the paramagnetic defects. A probing volume (PV) in the solid state material is thereby defined by the spatially overlapping volume of the optical excitation by the irradiation laser (25), the coupling structure (30) also exciting the defects, and the (Continued)

constant magnetic field. The magnetometer then measures an unknown magnetic field by detecting emission (27), e.g. fluorescence, from the defects in the probing volume (PV) from the double excitation of the defects by the irradiation laser, and the coupling structure exciting these defects.

18 Claims, 16 Drawing Sheets

(56) References Cited

U.S. PATENT DOCUMENTS

| | | |
|---|---|---|
| 2011/0062957 A1 | 3/2011 | Fu et al. |
| 2014/0077231 A1 | 3/2014 | Twitchen et al. |
| 2014/0166904 A1 | 6/2014 | Walsworth et al. |
| 2014/0191752 A1 | 7/2014 | Walsworth et al. |
| 2015/0090033 A1* | 4/2015 | Budker .................. G01R 33/46 73/504.05 |
| 2015/0192532 A1 | 7/2015 | Clevenson et al. |
| 2017/0139017 A1* | 5/2017 | Egan ...................... G01N 21/63 |
| 2017/0212185 A1* | 7/2017 | Hahn .................... G01R 33/032 |
| 2018/0203080 A1* | 7/2018 | Acosta ................. G01R 33/323 |
| 2018/0246143 A1* | 8/2018 | Grinolds ............ G01R 33/1284 |

FOREIGN PATENT DOCUMENTS

| | | |
|---|---|---|
| WO | WO 2017/015713 A1 | 2/2017 |
| WO | WO 2017/087014 A1 | 5/2017 |

OTHER PUBLICATIONS

Clevenson, Hannah et al., "Broadband magnetometry and temperature sensing with a light-trapping diamond waveguide" Nature Physics, May 2015, pp. 393-397, vol. 11.
Israelsen, Niels Møller et al., "Increasing the photon collection rate from a single NV center with a silver mirror" Journal of Optics, 2014, pp. 1-8, vol. 16, No. 114017.
Jensen, K. et al., "Cavity-Enhanced Room-Temperature Magnetometry Using Absorption by Nitrogen-Vacancy Centers in Diamond" Physical Review Letter, Apr. 2014, pp. 160802-1-160802-5, vol. 112.
Robledo, Lucio et al., "Spin dynamics in the optical cycle of single nitrogen-vacancy centres in diamond" New Journal of Physics, 2011, pp. 1-11, vol. 13, No. 025013.
Schirhagle, Romana et al.,"Nitrogen-Vacancy Centers in Diamond: Nanoscale Sensors for Physics and Biology" Annu. Rev. Phys. Chem., 2014, pp. 83-105, vol. 65.
Taylor, J.M. et al., "High-sensitivity diamond magnetometer with nanoscale resolution" Nature Physics, Oct. 2008, pp. 810-816, vol. 4.
International Search Report for PCT/EP2018/067643 dated Sep. 19, 2018.

* cited by examiner

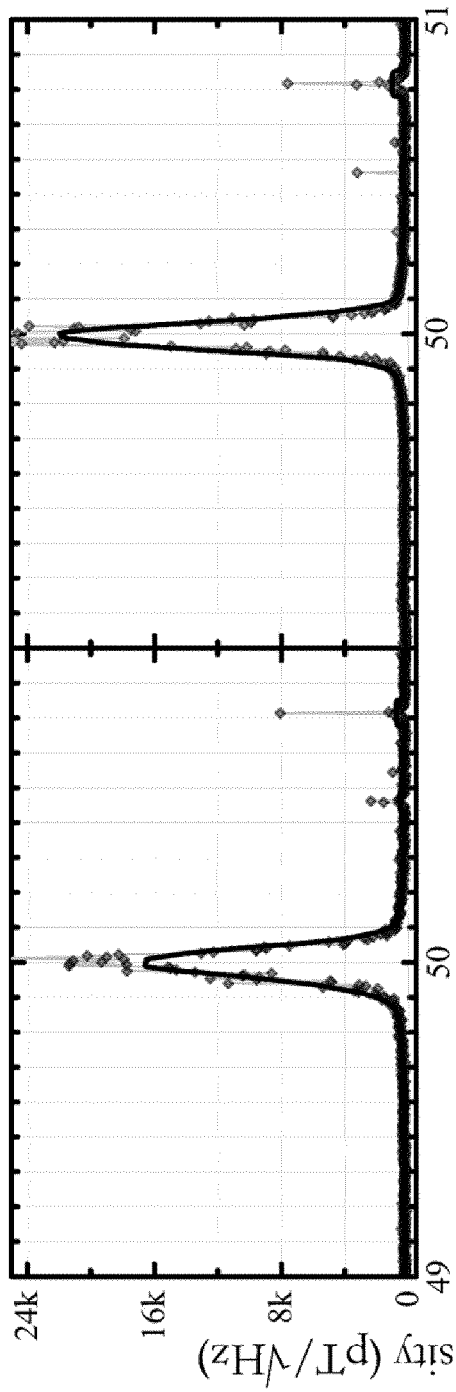
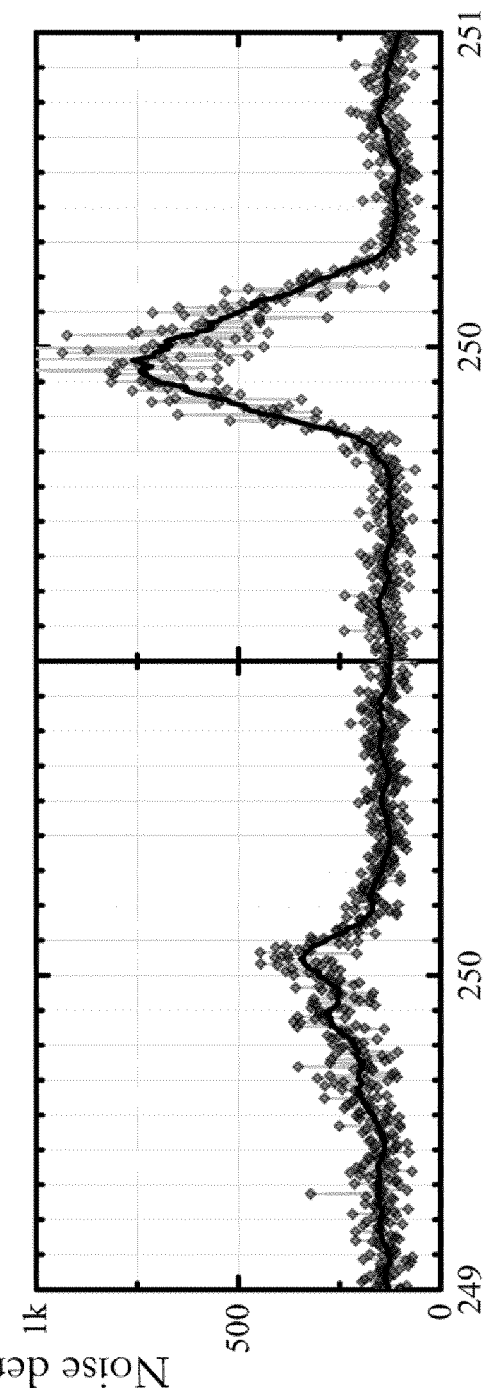
Fig. 5A i:
Fig. 5A ii:

MAGNETOMETER FOR MEASURING AN UNKNOWN EXTERNAL MAGNETIC FIELD

CROSS REFERENCE TO RELATED APPLICATIONS

This application is a U.S. National Phase Application of PCT International Application Number PCT/EP2018/067643, filed on Jun. 29, 2018, designating the United States of America and published in the English language, which is an International Application of and claims the benefit of priority to European Patent Application No. 17178726.0, filed on Jun. 29, 2017. The disclosures of the above-referenced applications are hereby expressly incorporated by reference in their entireties.

FIELD OF THE INVENTION

The present invention relates to a magnetometer for measuring a magnetic field using optically active defects in a solid state material, such as a crystal diamond with nitrogen-vacancies centers or defects, and a corresponding method for measuring such magnetic fields.

BACKGROUND OF THE INVENTION

Conventional magnetometer products consist of MEMS-based microchips with sensitivities scaling down towards the 10 nano-Tesla/Hz^(½) level, which limits their applicability to sensing large fields such as those stemming from geomagnetic processes, or electro/magneto-electronics. Their application is also limited to particular processes at a time as they are only capably of sensing within narrow frequency bandwidths, in environments that will not degrade their electronic functionality.

Apart from diamond-based magnetometers, high sensitivity magnetometers (with pico- to femto-Tesla sensitivities) are only achieved with atomic vapor cells and superconducting interference devices. Atomic vapor is toxic, and while it is enclosed in a glass cell, it may only find limited use in a clinical setting due to safety reasons. In addition, superconducting devices require cryogenic temperatures making them extremely expensive and limited in their applicability.

The nitrogen-vacancy (NV) center, an atom-like defect within a diamond crystal lattice, is an auspicious quantum sensor because of its readily polarized and detected spin state. The characteristics of the NV combines high sensitivity and spatial resolution allowing for the detection of spatial temperature gradients, electric fields, and magnetic fields, all at room temperature by measuring the fluorescence contrast via optically detected magnetic resonance (ODMR), cf. the recent review article "Nitrogen-Vacancy Centers in Diamond: Nanoscale Sensors for Physics and Biology" by Romana Schirhagl et al. in *Annu. Rev. Phys. Chem.* 2014. 65:83-105. By using an N size ensemble of NV centers, the collective sensitivity is boosted by a factor of $N^{(-1/2)}$. Developing diamond ensemble-based magnetic sensors presents advantages over their atomic-vapour and superconducting equivalents, in particular in terms of their relative simplicity, integrability in a variety of devices, and biological compatibility. The methods developed for the collective control and readout of an NV ensemble for sensing applications should also be useful for scalable quantum information schemes using ordered ensembles, or for potentially coupling NV ensembles to atomic vapours to create hybrid quantum systems for fundamental and applied experiments.

Recently, the area of ODMR has received significant interest due to the possibility of the very high sensitivity of the measured magnetic field, particular opening the way for measuring magnetic fields in living biological tissue. However, to reach the needed sensitivity for such measurements, the concentration of NV centers has hitherto been increased artificially and/or the optical collection efficiency has been increased by more advanced optical configurations, both factors leading to more complex or relatively costly measuring configurations of the ODMR based magnetometers. Another consideration for further improving the magnetometers is the need for miniaturization for use in areas of more difficult accessibility or because the spatial resolution must be improved.

Jensen et al. in *Physical Review Letters*, 112, 160802 (2014) demonstrated a cavity-enhanced room-temperature magnetometer also based on nitrogen-vacancy centers (NV) in diamond. Magnetic resonance is detected using absorption of light resonant with the 1042 nm spin-singlet transition. The diamond is placed in an external optical cavity to enhance the absorption, and significant absorption is observed even at room temperature. The study demonstrate a magnetic field sensitivity of $2.5$ $nT/(Hz)^{1/2}$, and a quantum projection-noise-limited sensitivity of $250$ $fT/(Hz)^{1/2}$. However, this study suggests further nitrogen vacancy centers to be positioned in the artificial diamond, which is complicated and expensive in itself, and increasing the NV concentration may also cause various optical saturations effects, thus this magnetometer configuration for ODMR has certain shortcomings for increasing the sensitivity. Furthermore, this technique requires at least two lasers, one for pumping and one for probing the absorption making it more difficult to perform miniaturization.

Hence, an improved ODMR based magnetometer would be advantageous, and in particular a more efficient and/or reliable magnetometer would be advantageous.

OBJECT OF THE INVENTION

It is a further object of the present invention to provide an alternative to the prior art.

In particular, it may be seen as an object of the present invention to provide a more efficient magnetometer that solves the above mentioned problems of the prior art with improved sensitivity and/or capability of miniaturisation.

SUMMARY OF THE INVENTION

Thus, the above described object and several other objects are intended to be obtained in a first aspect of the invention by providing a magnetometer for measuring an unknown external magnetic field (B_E) using optically detected magnetic resonance (ODMR), comprising:

a) a solid state material comprising an ensemble of paramagnetic defects, the paramagnetic defects being optically active, b) an optical cavity surrounding the solid state material, the optical cavity being optically excitable by an irradiation laser arranged therefore, c) a coupling structure being arranged for electromagnetic coupling to said solid state material, the coupling structure being arranged for substantially homogenous radio frequency and/or microwave excitation of the paramagnetic defects, and d) a magnetic source providing a substantially constant, directional magnetic field (B_C) within the said solid state material, said constant directional magnetic field being sufficient to cause a Zeeman splitting of the energy levels in said paramagnetic defects, wherein a probing volume (PV) in the solid state material is defined by the spatially overlapping volume of:
1) the excitation of the paramagnetic defects by the irradiation laser,
2) the coupling structure exciting the same paramagnetic defects defined in step 1), and
3) the constant directional magnetic field (B_C), and
wherein the magnetometer is configured to measure the external magnetic field (B_E) by detecting emission from the paramagnetic defects in the probing volume (PV) by utilising the double excitation of the said excitation of the paramagnetic defects by the irradiation laser, and the said coupling structure exciting the same paramagnetic defects.

The invention is particularly, but not exclusively, advantageous for obtaining a magnetometer, which has enhanced efficiency and responsivity of fluorescence light generation facilitated by the particular integration and use of the optical cavity and RF/microwave coupling structure, e.g. via a resonant antenna. Specifically, the high efficiency relates to the fact that to obtain the same level of sensitivity conventionally (e.g. without the use of the optical cavity), at least an order of magnitude larger power of irradiation laser for excitation, e.g. green laser light, is required.

Another advantage as compared to for example Jensen et al. mentioned above is that the present invention can be implemented with one only irradiation laser for excitation of the paramagnetic defects, whereas the Jensen et al. setup requires two laser source, one for pumping the optical cavity and one for probing.

The magnetometer of the present invention may therefore have direct applications in fields ranging from sub-surface geophysical exploration, to biomedical sensing and imaging of magnetically active processes/specimens (both ex- and in-situ) due to its ease of handling, non-toxicity, and low optical power consumption compared to competing technologies available.

Notice in that the irradiation laser used for exciting the optical defects may or may not form an integral part of the magnetometer. Thus, in some embodiments of the present invention the irradiation laser may be part of an overall entity forming the magnetometer, e.g. included in the same housing, attached thereto or similar, but alternatively, in other embodiments of the present invention, the irradiation laser may form another entity exterior or different from, for example, the solid state material with the optical active defects. The latter may for instance be relevant for embodiments, where the solid state material is only used once and then discharged after being used one time, like in medical and/or biological applications where strict hygienic/safety considerations may require so.

The advantageous design of the RF/microwave coupling structure, e.g. a microwave resonator, particular a ring resonator, and its integration within an optical cavity, results in an unprecedented level of sensitivity and efficiency to be achieved using an off-the-shelf, commercially available diamond crystal for the solid state material. The integration of e.g. a microwave antenna within an optical cavity is not easily realizable, and the advantages this combination provides in terms of sensitivity and bandwidth are rather surprising due to the different mechanisms of the microwave and irradiation laser, e.g. green laser light, interaction with the optically active paramagnetic impurities in the diamond. Specifically, the optical cavity may counteract the sensitivity degrading mechanism occurring when applying high microwave power (optically induced line narrowing), which is needed to maximize the responsivity of the diamond paramagnetic impurities to an external magnetic field. Interfacing these two fields in such a way that they overlap uniformly with a given probe volume of the diamond, in addition to the power amplifying mechanism of the optical cavity, is a quite surprising effect from the present invention. This beneficial approach is un-achievable through conventional techniques and setups used routinely in the field hitherto. Examples include, but are not limited, to ring resonators, coils, antennas and other electric devices suitable to create the required electromagnetic field as the skilled person will readily understand once the teaching and principle of the present invention is understood.

In the context of the present invention, it is to be understood that 'measuring an unknown external magnetic field (B_E)' may include measuring a direction and/or a magnitude of the magnetic field desirable to measure. In particular, it is also be understood that the magnetometer according to the present invention may measure a direction and/or a magnitude of the magnetic field along a certain axis, e.g. a quantization axis of the paramagnetic defects, thereby measuring effectively a projection of the external magnetic field along said axis. The skilled person in magnetometers, particular ODMR-based magnetometer, will readily understand that if any additional projection(s) of the external magnetic field is desirable to measure, it is possible to change quantization axis of the defect, e.g. by changing the direction of the otherwise constant, directional magnetic field (B_C) giving the Zeeman splitting of the paramagnetic defects. Thus, making three measurements along different quantization axis may yield the total magnetic field vector, either three measurements consequently in time using one magnetometer, or three combined measurements using three parallel magnetometers at the same time, or any combinations of these configurations for measuring direction and magnitude of the external magnetic field. If time development of the external magnetic field is of importance, several magnetometers according to the present invention, each having different axis of quantization, would of course be feasible. For further variants and details for measuring the direction and magnitude of an external magnetic field (B_E) using ODMR from NV diamond having four crystallographic axis, the skilled reader is referred to WO 2016/126436 (to Lockheed Martin Corp.), which is hereby incorporated by reference in its entirety.

In the context of the present invention, an 'optical cavity' may be understood to comprise at least two reflecting mirrors (or similar optical entities) mutually arranged for being capable of reflecting light within the optical civility for creating a standing wave of light. Optical cavities are also known as optical resonators or resonating cavities as the skilled person in optics will readily appreciate. In variants of the invention, the optical cavity may have at least two reflecting surfaces having the functionality that the reflecting surfaces in combination create and sustain an optical cavity with standing optical waves between the reflecting surfaces. Notice that the reflecting surfaces may be supplementing or complementing the concept of a conventional mirror as long as the reflecting surfaces reflect the appropriate wavelength for implementing the present invention. In one embodiment explained in more detail below, diamond is used as the solid state material and on the diamond at least two thin reflecting films are deposited to constitute mirror-like surfaces and thereby collectively form an optical cavity.

In the context of the present invention, the 'coupling structure being arranged for electromagnetic coupling to said solid state material' may be understood to be capable of excitation of the paramagnetic defects in the radio frequency or microwave range of electromagnetic radiation. Thus, an antenna or a suitable nearby waveguide may be examples of said coupling structure in the context of the present invention. Radio frequency (RF) radiation may be broadly understood to be electromagnetic radiation approximately in the 3 kHz to 300 GHz range, and microwave radiation being typically in the approximate range of 300 MHz to 300 GHz, particularly microwave radiation of at least 1 GHz, 2 GHz, or 3 GHz may be applied in the context of the present invention. The coupling structure is further arranged for homogenous excitation in said probe volume in the solid state material, e.g. in the crystal diamond, more particular the excitation varies maximum 5%, maximum preferably 2.5%, most preferably maximum 1% across the probe volume in the solid state material.

In the context of the present invention, the 'magnetic source providing a substantially constant, directional magnetic field (B_C) within the said solid state material' is understood to cause a Zeeman splitting above the size of the magnetic field originating from the Earth which is around 25-65 micro Tesla (depending on the position on Earth), as it will be explained further below.

In an embodiment, the optical cavity surrounding the solid state material comprises at least two mirrors and wherein the magnetometer comprises:

a first optical detector being optically connected to the optical cavity and arranged for providing a signal output to a feedback mechanism or cavity lock (200) for adjusting the said optical cavity, preferably by actuating or otherwise change optical properties of one, or more, of the at least two mirrors, e.g. it is possible to move the mirror, modify the mirror electro-statically, or shift the laser frequency, and/or a second optical detector being optically configured for detecting emission, preferably luminescence, more preferably fluorescence, from the solid state material. The possibility of having two separate optical detectors facilitates a luminescence or fluorescence magnetometer configuration, whereby only a single irradiation source is needed, provided that sufficient collection efficiency can be achieved, which is indeed demonstrated to be the case for the present invention.

In one embodiment of the invention, the first optical detector may be operating alone i.e. without the second optical detector.

Preferably, the second optical detector may however be optically arranged for receiving emission, e.g. luminescence or fluorescence from the said paramagnetic defects, said received luminescence or fluorescence having an optical path towards the second optical detector, which is different from an optical path defined by radiation in the optical cavity from the irradiation laser, such as being transverse to the resonant radiation in the optical cavity, as it will be explained in more detail below. In the following the fluorescence of the emitted defects will be considered, but it will be understood by the skilled person in optics that in some embodiments, luminescence in general may be utilised in the context of the present invention.

It may be mentioned that in principle only one photo detector could be used to both lock-in of the optical cavity and detect the fluorescence, though this is more complex to implement.

In an advantageous embodiment, the magnetometer may be arranged for reducing noise by applying a difference between an output from the first detector and an output from the second detector and a common mode rejection ratio (CMRR) on said difference, which is demonstrated below in connection with the detailed description, particularly FIGS. 5A' and 5D and the corresponding description.

In an advantageous embodiment, the solid state material may comprise at least one two-dimensional or three-dimensional cut-corner, said cut-corner having a geometry where the corner is truncated with a facet. Technically, this result in less internal reflection, preferably total internal reflection, and improved light collection, a modelling performed by the inventors indicate that surprising high increase of about 10 to 20 times is achieved by this out coupling of the emitted light from the paramagnetic defects. Preferably, the second optical detector may be optically configured for detecting said fluorescence from the solid state material through said cut-corner in the solid state material.

In another advantageous embodiment, said coupling structure may have at least a portion of the structure in physical contact with the solid state material, e.g. it may be deposited on the diamond. Alternatively or additionally, the said coupling structure, e.g. resonant microwave antenna, may have at least a portion of the structure with a ring-like symmetry, preferably with said probe volume (PV) being substantially positioned within the center of the ring-like symmetry, as it will be further explained below.

In a further advantageous embodiment, the optical cavity surrounding the solid state material may be integrated in the solid state material by manufacturing at least two mirrors on opposing sides of the solid state material. In some embodiments, it is possible to have one mirror manufactured in, or on, the solid state material, which is then optically cooperating with an external mirror to form the optical cavity surrounding the solid state material.

In another embodiment, the optical cavity surrounding the solid state material may have a maximum cumulative round trip loss product in the cavity, ρ, of 20, 10, or 5%. Alternatively or additionally, the irradiation laser may be configured to be substantially resonant with the optical cavity.

Furthermore, the optical cavity may impedance matched with the irradiation laser, preferably substantially impedance matched, preferably so that said impedance matching is performed by levelling an incoupling mirror as being substantially equal to the cumulative round trip loss product in the cavity, more preferably by configuring the magnetometer according to the approximate relation $$P_{cav}=P_{laser}T_1/(1-\rho)^2,$$

where $T_1$ is the transmission of an incoupling mirror, ρ is the cumulative round trip loss product in the cavity, $P_{laser}$ is the power of the irradiation laser, and $P_{cav}$ is the intra-cavity power, and it is understood that impedance matching is obtained when ρ approaches $T_1$. Preferably, wherein the irradiation laser may be configured for being emitted as a continuous wave when measuring the external magnetic field (B_E).

Advantageously, the constant directional magnetic field (B_C) may be homogeneous to the extent that Zeeman energy splitting across the probe volume (PV) is less than the linewidth of the needed excitation of the paramagnetic defects, as it will be understood for the skilled person in ODMR. Furthermore, the constant directional magnetic field (B_C) may be directed substantially along a quantization axis of the defects. As explained above, the constant magnetic field (B_C) may be changed in direction depending on the required direction that the external magnetic field (B_E) is to measured.

Beneficially, the solid state material may be a single crystal diamond, and the paramagnetic defects are nitrogen vacancies centers (NV), preferably with impurities levels of NV being maximum 5 ppb, preferably maximum 1 ppb, more preferably maximum 0.5 ppb. These levels are at a level commercially available at a reasonable level, which facilitates that the present invention is not dependent on high-level NV diamond, thus paving the way for various commercial applications of diamond based ODMR. Thus, the magnetometer—when measuring an external magnetic field (B_E)—may be arranged for having a sensitivity of maximum 300 pT/(Hz)^½, preferably a sensitivity of maximum 200 pT/(Hz)^½, more preferably a sensitivity of maximum 50 pT/(Hz)^½, or even more preferably 5 or 1 pT/(Hz)^½, which is highly beneficial for various applications where high sensitivity magnetometry has hitherto not been possible.

In a second aspect, the present invention relates to a method for measuring an external magnetic field (B_E) using optically detected magnetic resonance (ODMR), comprising:

a) providing a solid state material comprising an ensemble of paramagnetic defects, the paramagnetic defects being optically active, b) arranging an optical cavity for surrounding the solid state material, the optical cavity being optically excitable by an irradiation laser arranged therefore, c) providing a coupling structure being arranged for electromagnetic coupling to said solid state material, the coupling structure being arranged for substantially homogenous radio frequency and/or microwave excitation of the paramagnetic defects, and d) providing a substantially constant, directional magnetic field (B_C) from a magnetic source close to the said solid state material, said constant directional magnetic field being sufficient to cause a Zeeman splitting of the energy levels in said paramagnetic defects, wherein a probing volume in the solid state material is defined by the spatially overlapping volume of:

1) performing the excitation of the paramagnetic defects by the irradiation laser, 2) arranging the coupling structure for exciting the same paramagnetic defects defined in step 1), and 3) providing the constant directional magnetic field (B_C), and wherein the method performs a measurement of the external magnetic field (B_E) by detecting emission from the paramagnetic defects in the probing volume by utilising the double excitation of the said excitation of the paramagnetic defects by the irradiation laser, and the said coupling structure exciting the same paramagnetic defects.

The individual aspects of the present invention may each be combined with any of the other aspects. These and other aspects of the invention will be apparent from the following description with reference to the described embodiments.

BRIEF DESCRIPTION OF THE FIGURES

An embodiment of a magnetometer using ODMR according to the present invention will now be described in more detail with regard to the accompanying figures. The figures show one way of implementing the present invention and is not to be construed as being limiting to other possible embodiments falling within the scope of the attached claim set.

DETAILED DESCRIPTION OF AN EMBODIMENT

Figure 1A:
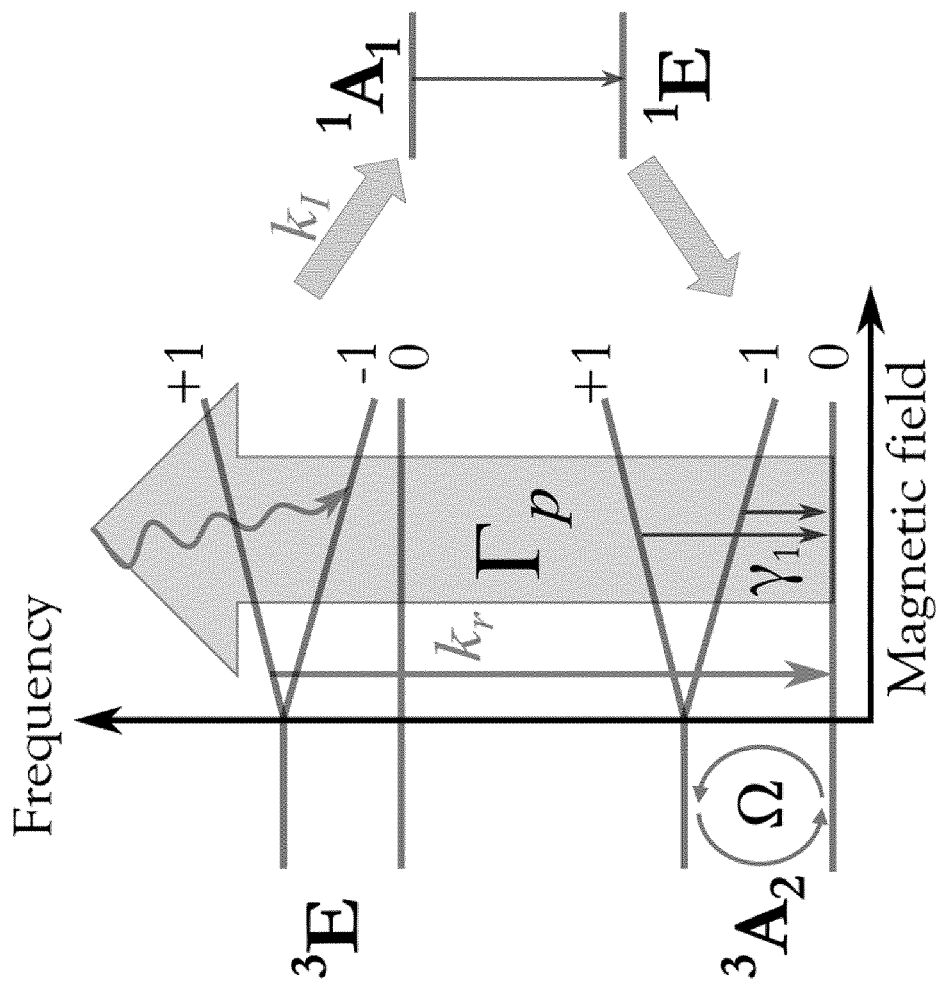
FIG. 1A is an energy diagram of the NV defects in diamond.
Figure 1B:
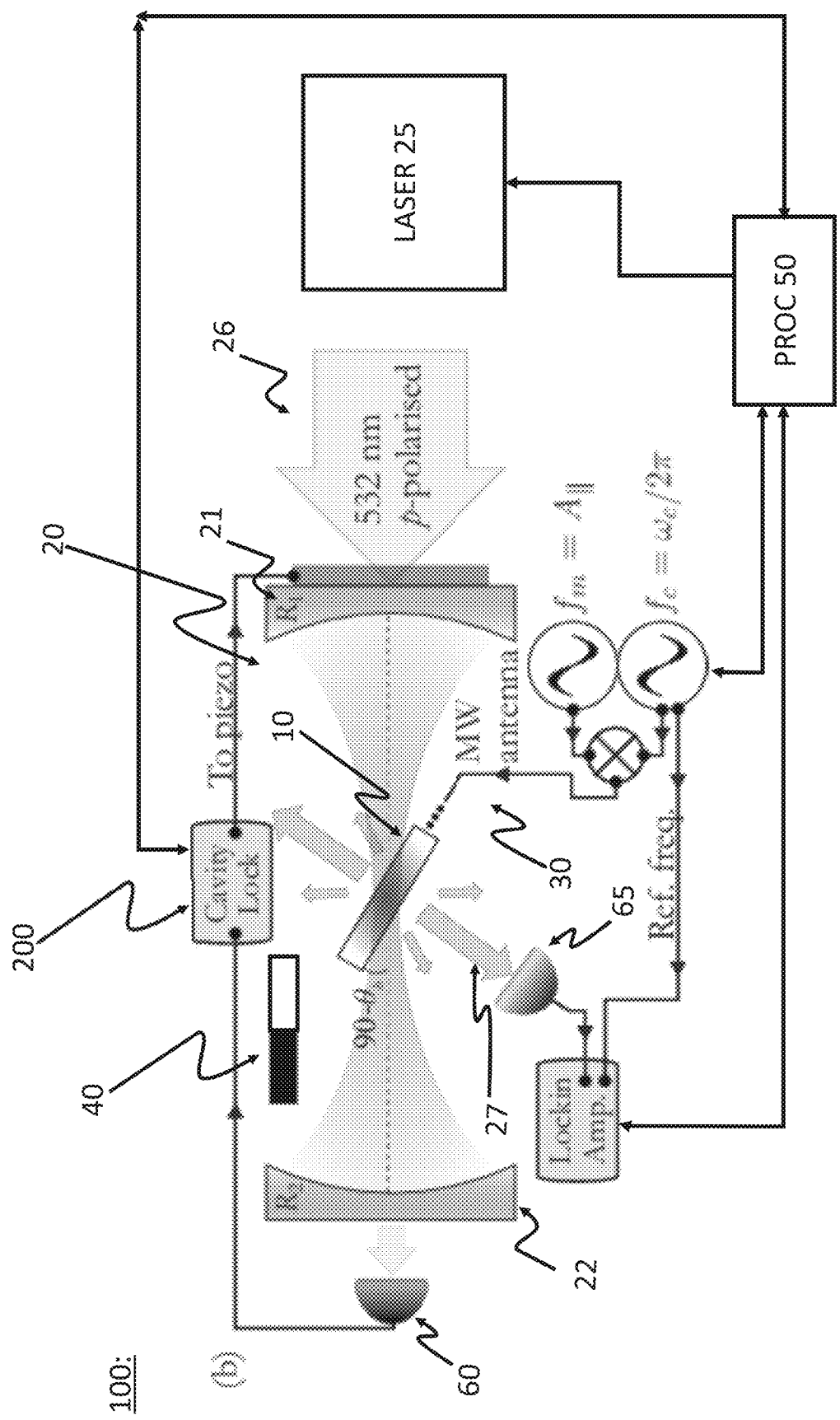
FIG. 1B is a schematic drawing of the experimental setup of a magnetometer using ODMR according to the present invention.

FIG. 1A is an energy diagram of the NV defects in diamond, where the electronic configuration of the NV center (schematic shown in FIG. 1($a$)) exhibits spin-dependent fluorescence by virtue of the difference between the $m_s=\pm 1$ and the $m_s=0$ spin levels inter-system crossing rates ($k_I$) from the $^3E$ excited triplet state to the shelving singlet states ($^1A_1$-$^1E$). In a simplified continuous wave (cw) picture for an ensemble of identical systems, the radiative relaxation rate ($k_r$) of all the excited state levels competes with $k_I$ to bring about a fluorescence contrast (C) based on the initial distribution of the spinstate population in the triplet ground states ($^3A_2$). This ground state spin population is set by the ratio between the optical read-out pump rate $\Gamma_p$ from above-band excitation (in this case a 532 nm laser), and the resonant microwave (MW) drive rate of the spin levels (Rabi frequency $\Omega$), of which the optical above-band excitation mechanisms is near-perfect spin conserving. The presence of a local magnetic field breaks the degeneracy of the ms=±1 spin levels in the ground and excited states, splitting them with a scaling proportional to the product of the gyromagnetic ratio $g_e$ approximately 28 MHz/mT and the projection angle of the magnetic field along the NV symmetry axis. Given the four possible crystallographic orientations of a single NV within the diamond unit cell (along all four <111> directions), this results in four distinct NV group alignments for a given magnetic field. In the experimental setup, the splitting of these groups is tuned via the placement of a permanent rare-earth magnet 40, cf. FIG. 1B, on a three-axis translation stage in the vicinity (not shown in FIG. 1B). A coil magnet is also placed next to the diamond (offset from the optical cavity path), to generate weaker fields for assessing the systems response to low-frequency AC magnetic fields. The presence and magnitude of a local magnetic field is directly detected by monitoring the change in fluorescence of one of these aligned groups as a function of applied MW frequency $\omega_c/2\pi$. As a result, the detection sensitivity using the ODMR spectrum $S_{cw}$ is limited by the inverse of the maximum MW-dependent rate of fluorescence change, [max $\{d_w S_{cw}\}]^{-1}$, where $d_w$ denotes derivative with respect to MW frequency.

FIG. 1B is a schematic drawing of the experimental setup of a magnetometer 100 using ODMR according to the present invention. Thus, in general a magnetometer 100 for measuring an unknown external magnetic field (B_E) using optically detected magnetic resonance (ODMR), comprises a solid state material 10, such as crystal diamond like in this embodiment, but alternatively SiC, sapphire, etc. may be applied, which comprises an ensemble of paramagnetic defects, the paramagnetic defects being optically active. Furthermore, an optical cavity 20 surrounds the solid state material with two mirrors 21 and 22, the optical cavity being optically excitable, cf. $\Gamma_p$ in FIG. 1A, by an irradiation laser 25, e.g. a green cw laser as shown in FIG. 1B arranged therefore.

Additionally, a coupling structure 30 is arranged for electromagnetic coupling to said solid state material, the coupling structure being arranged for substantially homogenous radio frequency and/or microwave excitation ($\Omega$) of the paramagnetic defects, and a magnetic source 40, e.g. a permanent magnet, provides a substantially constant, directional magnetic field (B_C) within the said solid state material 10, said constant directional magnetic field being sufficient to cause a Zeeman splitting of the energy levels in said paramagnetic defects.

During measurements there is effectively a probing volume PV in the solid state material 10 being defined by the spatially overlapping volume of:

1) the excitation of the paramagnetic defects by the irradiation laser 25, 2) the coupling structure 30 exciting the same paramagnetic defects defined in step 1), and 3) the constant directional magnetic field (B_C), and Using ODMR the magnetometer 100 is configured to measure the external magnetic field (B_E) in the probing volume PV by utilising the double excitation of the said excitation of the paramagnetic defects by the irradiation laser, and the said coupling structure exciting the same paramagnetic defects. The process is controlled by one or more processor 50 operably connected to the first 60 and second 65 detectors, the laser 25, the coupling structure 30, e.g. the MW antenna as shown here, and other components as shown schematically in FIG. 1B.

More specifically, confocal-cavity-assisted ODMR is carried out using the native $^{14}$NV concentration of a polished and untreated single-crystal diamond (6 mm×6 mm×1.2 mm, retrieved from the company Element 6) grown using chemical vapour deposition (CVD), with a quoted substitutional nitrogen concentration [Ns] of <1 ppm. The diamond is mounted on a home-built apertured PCB-board, patterned with a MW split-ring resonator and, as shown in the schematic in FIG. 1B, placed vertically in-between two confocal cavity mirrors at a Brewster angle of $\theta_b$=67±0.4 degrees relative to the cavity's longitudinal axis. Both cavity mirrors, R1 21 and R2 22, have a curvature radius of 10 cm and are anti-reflection coated for 532 nm on the flat ends.

The measured reflectivities are R1=94.8% and R2=99.8%, giving a projected finesse F of 113±4. The measured finesse of the empty cavity is F=114, shown in FIG. 2(a), agrees well within the error of the projected value. An unequal mirror reflectivity was chosen in order to approach impedance matching conditions when incorporating the diamond. The cavity is pumped with a phase-modulated and p-polarised, 532 nm laser possessing a single longitudinal mode (Verdi SLM Coherent, RMS<0.03% from 10 Hz-100 MHz), and Pound-Drever-Hall locked using the transmitted light through R2 22, and a piezo actuator attached to the incoming R1 21 mirror mount. The confocal configuration of these mirrors results in a Laguerre-Gaussian LG00 mode with a 1/e beam waist of 92 m and a Rayleigh length of 50 mm. With the diamond incorporated at its Brewster angle $\theta_b$, and accounting for the standing-wave spatial intensity profile, an effective 1/e excitation volume of 3.5×10$^{-2}$ mm$^3$ is obtained, considering the LG00 transverse beam profile. The overall influence of the spatial standing-wave intensity variations were observed to be negligible when performing comparative measurements with and without the use of the cavity mirrors for similar optical excitation powers. Due to the expected uniform spatial distribution of the NV centers, the same total fluorescence rate is expected when comparing a flat and sine spatial profile with the same average intensity.

For sensing-based measurements, fluorescence 27, cf. FIG. 1B, is collected directly from the large face of the diamond using either a NA=0.7 objective (Mitutoyo, 77% transmission efficiency at 700 nm), or a NA=0.79 condenser lens (Thorlabs ACL25416U-B, 99.7% transmission efficiency at 700 nm) and filtered using a long-pass filter with a 600 nm cut-on. Considering the refractive index of diamond, the numerical aperture of the objective, and loss from the remaining optical components, the total collection efficiency is estimated to be <2%. The collected fluorescence is focused onto a Si-biased detector (Thorlabs DET36A with 70% quantum efficiency at 700 nm) attached with a 10 kΩ load and a 400 kHz detection bandwidth. This detector signal is noise-filtered and amplified using a lock-in amplifier (Stanford Research Systems SR510) through either amplitude or sine-wave frequency modulation of the MW drive (30 kHz modulation rate and 0.5 MHz modulation depth), for which the in-phase quadrature is output. The lock-in amplifier input is set with a bandpass filter centered at the modulation frequency (6 kHz bandwidth), and the output is set with a 1 ms time constant, thereby imposing a first-order low pass filter with a corner frequency at 159 Hz. For simultaneously driving all three $^{14}$N hyper-fine lines, the modulated MW is mixed with a 2.16 MHz drive (corresponding to the axial hyper-fine splitting frequency $A_{||}$). The MW drive frequency $\omega_c/2\pi$ is delivered using a split-ring resonator, cf. FIG. 6, which has a measured resonance at 2.884 GHz and a bandwidth of 91 MHz. The spatial uniformity of delivered MW power was deduced from spatially-dependent measurements of the Rabi frequency using confocal microscopy, which was observed to vary by <2:5% over a region of ca. 1 mm$^2$, across the 1.2 mm thickness of the diamond. The equivalent $\Omega$ of the applied MW power was determined using pulsed excitation in the cavity configuration.

Figure 2:
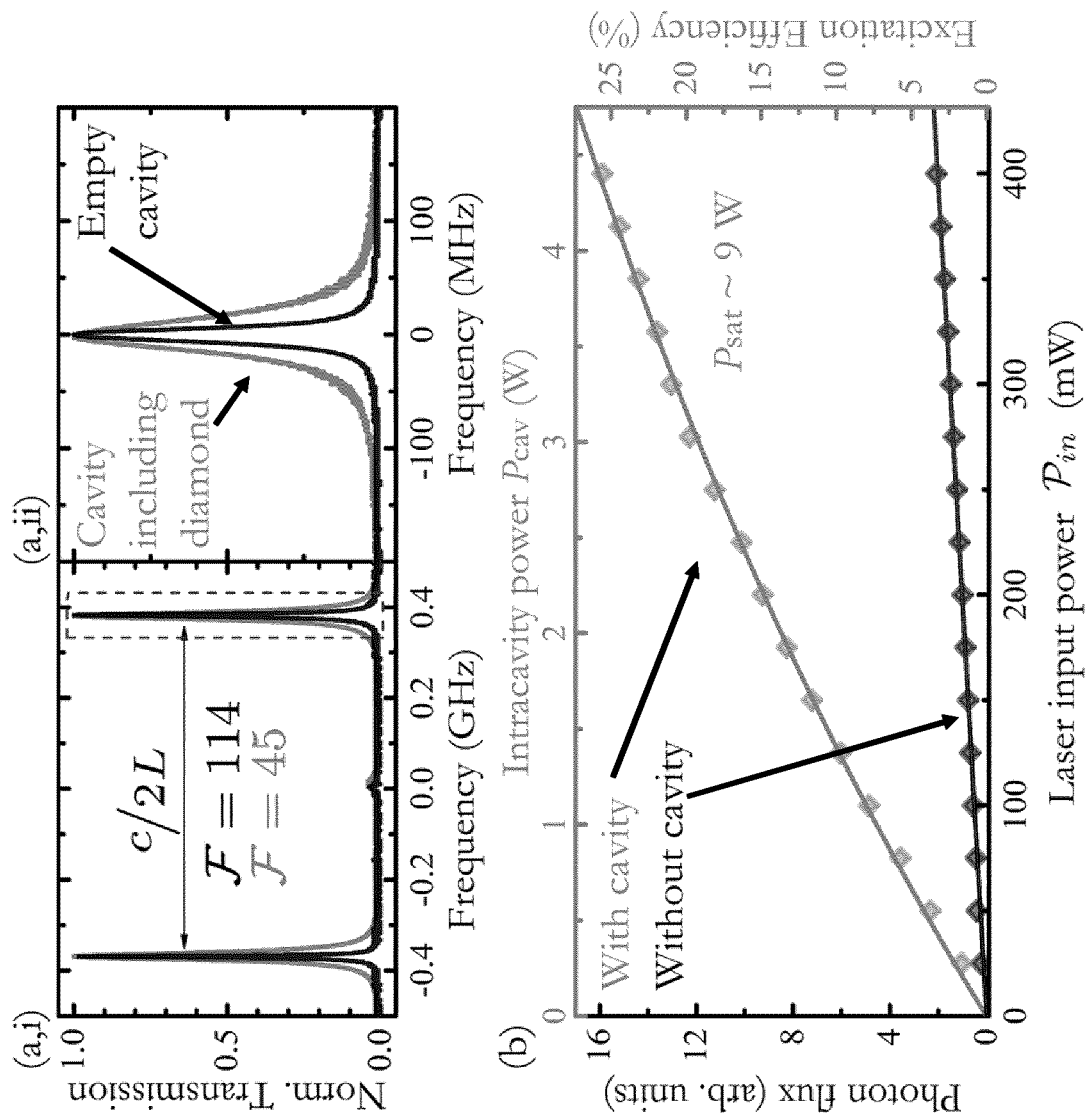
FIG. 2 shows characteristics of the optical cavity used in an embodiment of a magnetometer using ODMR according to the present invention.

FIG. 2 shows characteristics of the optical cavity used in an embodiment of a magnetometer using ODMR according to the present invention:

FIG. 2a,i shows Transmission spectrum of the cavity as a function of the laser frequency detuning for the cavity without and with the diamond, showing the dominance of the LG00 mode and a small negligible peak of the LG01 (evident from the displacement by half the free spectral range) for both instances, whereas FIG. 2a,ii shows a zoom-in of one of the transmission peaks highlighting the linewidth increase from 6.5 MHz to 17 MHz.

FIG. 2(b) shows relative power dependent photon flux in arbitrary units for collected light from the diamond without and with the cavity, plotted as a function of the cavity input $P_{in}$ and intra-cavity powers $P_{cav}$. The excitation efficiency $R/R_{sat}$ is also shown on the right scale for the cavity enhanced photon flux. The lower trace is a linear t fit, while the upper trace is a power-law t fit as discussed below.

Characteristics of the Confocal Cavity

The enhancement of the input laser power by the confocal cavity is estimated directly from the measured finesse F.

With the inclusion of the diamond and its associated absorption losses, a 60.5% reduction of the finesse is observed down to F=45, as shown in FIG. 2(a), along with a full free spectral range scan highlighting the dominance of the LG00 mode. The on-resonance relationship between the intra-cavity power $P_{cav}$ and the input power $P_{in}$ is approximately $P_{cav}=P_{in}T_1/(1-\rho)^2$, where $T_1$ is the transmission of the input mirror 21 and $\rho$=sqrt $(R_1R_2 e^{-\alpha})$ is the cumulative round-trip loss product, $\alpha$ being the propagation loss coefficient. $\rho$ is calculated from the polynomial root of its relation with the finesse and in the absence of the diamond, is assumed to be a function solely dependent on the product of $R_1R_2$. Using this relationship, a measured power-dependent flux rate is plotted in FIG. 2(b) as a function of $P_{cav}$ and $P_{in}$. A clear transition from a linear to a non-linear dependence is observed, which is fitted with $R=R_{sat}P/(P+P_{sat})$ to estimate the excitation efficiency $R=R_{sat}$, and the projected saturation power $P_{sat}$. These are estimated to reach 31% for $P_{in}$=0.4 W, and 50% for $P_{in}$ 0.87 W, which is an intra-cavity power of $P_{sat}$ of approximately 9 W.

Figure 3:
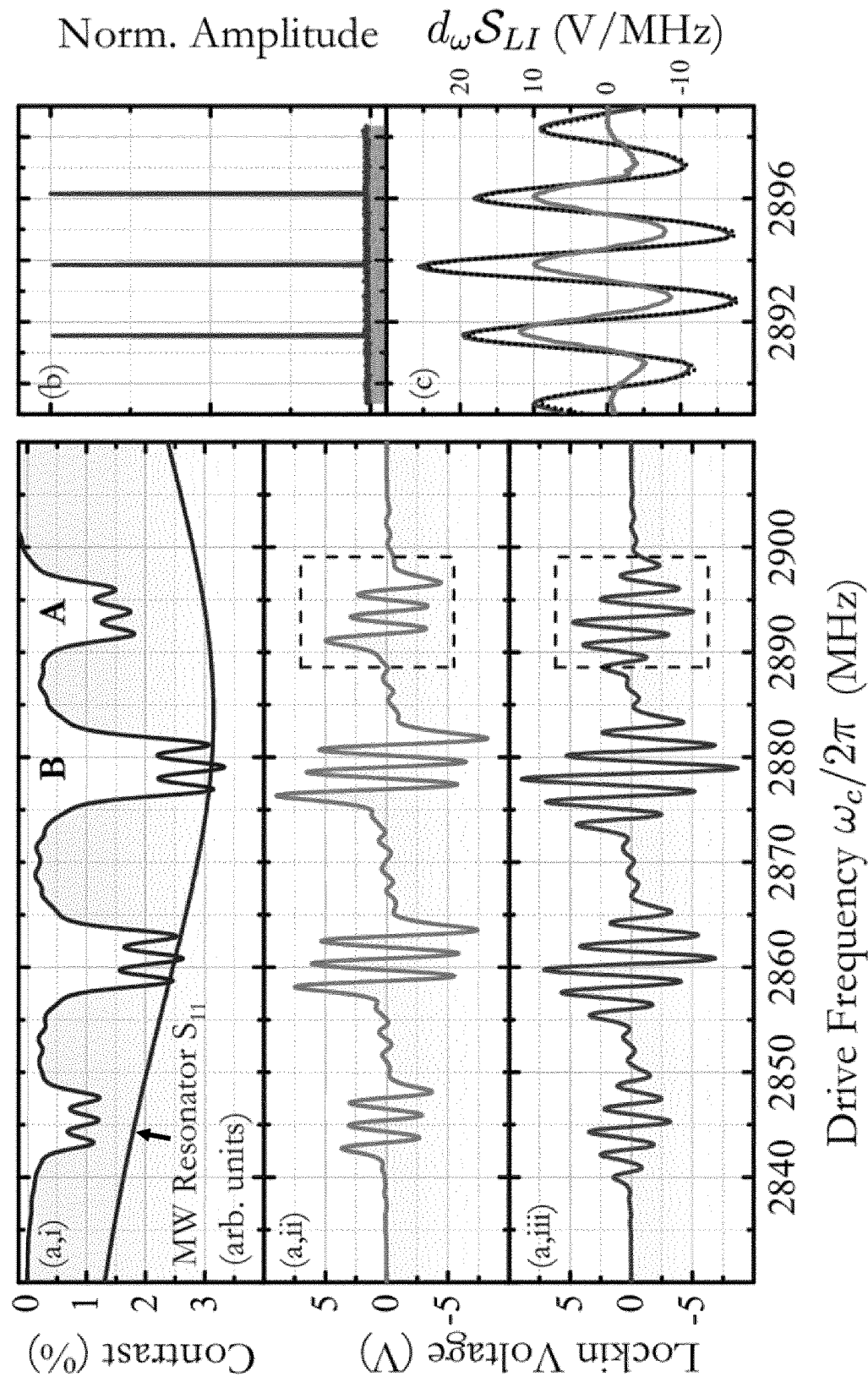
FIG. 3 shows details of the microwave excitation in an embodiment of a magnetometer using ODMR according to the present invention.

FIG. 3 shows details of the microwave excitation in an embodiment of a magnetometer using ODMR according to the present invention:

FIG. 3a,i shows an amplitude-modulated lock-in spectrum plotted in units of measured signal contrast as a function of MW drive frequency, with the frequency-dependent reflection parameter (S11) of the split-ring resonator antenna (separate line) incorporated for comparison (not sharing the y-axis with the trace). The frequency-modulated spectrum using single-frequency excitation (a,ii) and three-frequency excitation (a,iii) is shown for comparison.

FIG. 3(b) shows measured three-frequency excitation spectrum. FIG. 3(c) shows a plot of the derivative $d_w S_{LI}$ of peak A outlined in (a,ii) and (a,iii). A simulation of the signal is overlaid with the measured trace in (a,iii) (black dotted line).

Lock-In Amplified Magnetic Resonance Detection

The full ODMR spectrum of the $^3A_2$ spin states, and the corresponding lock-in detected signals are shown in FIG. 3. The spectrum in FIG. 3(a,i) is obtained through lock-in amplification using a pulsed MW signal, and highlights the deliberate alignment of the external magnetic field B_E along one of the <111> crystallographic directions, as well as the influence of the split ring resonator bandwidth. Given the four possible crystallographic orientations of the NV defect, only perfect alignment with one axis orientation at a time is possible for a simple magnetic field, which brings about spin-level degeneracy of the three other orientations. For an ensemble, splitting of the lines is generally desired in order to circumvent the degraded resonance lineshape (and therefore maximum derivative) resulting from residual stray fields that break the degeneracy of the four subgroups. It is also necessary in the case of pulsed schemes where optimal coherence times are required, but these advantages are brought about at the expense of contrast, which is clearly visible in FIG. 3(a,i) when comparing the leftmost peak to the two inner peaks. In the case of cw measurements and sensing schemes, such splitting is not strictly required and the advantage in detection of the enhanced contrast of three degenerate lines outweighs the reduced collective coherence. However, the three subgroups sensitivity is degraded by the non-parallel projection angle of an external magnetic field. Irrespective of how the sensed field is aligned with respect to the three subgroups, the gyromagnetic ratio is at best reduced by a factor of cos (54.7 degrees).

Figure 4:
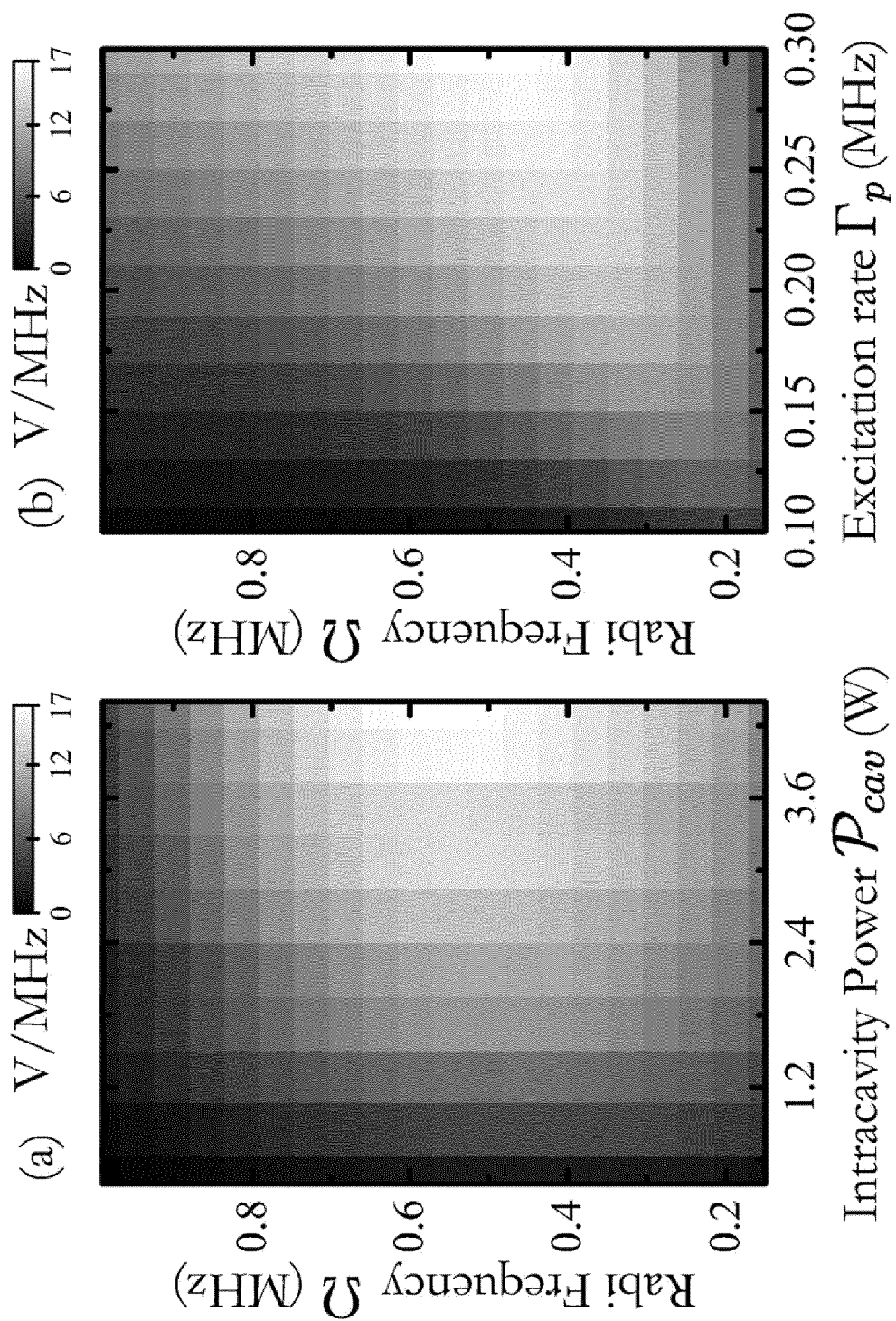
FIG. 4 is measured (left) and simulated (right) study of the optical cavity during use in an embodiment of the present invention.

The amplitude ratios of the inner and outer peaks, designated here group A and group B, respectively (labelled in FIG. 3(a)), do not posses a 1:3 ratio in this case due to the use of the split-ring resonator which ensures more spatially uniform power delivery at the expense of power-uniformity over the desired ODMR frequency window. The S11 trace of the loaded MW resonator is overlaid in FIG. 3(a,i) (in normalised arbitrary loss units) and shows a peak around 2.884 GHz, which is centered between the $m_s=\pm1$ spin levels of group A and B. FIG. 4 is measured (left) and simulated (right) study of the optical cavity during use in an embodiment of the present invention:

(a) Measured max$\{d_w S_{LI}\}$ for $\omega_c=\omega_0$ as a function of $\Omega$ and $\Gamma_p$ (b) Simulated comparison of plot in (a)

Briefly this comparison with a theoretical model highlights the occurrence of linewidth-narrowing and allows for the derivation of an optimum shot-noise-limited sensitivity for this embodiment of the invention. Both cw and lock-in spectra can be simulated using the steady-state solution of a five-level Bloch equation, set up with the rates reported in L. Robledo, H. Bernien, T. van der Sar, and R. Hanson, "Spin dynamics in the optical cycle of single nitrogen vacancy centres in diamond," New J. Phys. 13, 025013 (2011). An analytical expression is defined in terms of the steady-state solutions of the excited state populations $I_{cw}$ as a function of $\Gamma_p$, $\Omega$, and detuning of the drive frequency $\omega_c/2\pi$ relative to the peak resonance frequency $\omega_0/2\pi$. The result is a projected sensitivity calculated as:

$$\delta B = \frac{\mathcal{A}(80nV/\sqrt{Hz})}{\max\{d_\omega S_{LI}\}\gamma_e} \sim 160 pT/\sqrt{Hz},$$

for $\Omega$=5.7 MHz and $\Gamma_p$=6 MHz, which corresponds to a cavity input power of $P_{in}$=1.1 W. While sensitivity should scale inversely with the square root of the number of NVs, the measured absorption fraction and simulations indicate that the expected excitation power needed to optimise max$\{d_w S_{cw}\}$ is strongly non-linear with respect to the number of emitters. While this will depend on how exactly NV densities are increased and the resulting ratio between NVs and other absorbing impurities, this suggests that increasing ensemble densities to maximise sensitivities may not be an optimal strategy as the power required to optimise max$\{d_w S_{cw}\}$ may be difficult to experimentally maintain. Instead, further improvement of collection efficiencies and detection electronics (in terms of photodetector responsiveness, and low-noise pre-amplification) would be more practically realisable.

Enhanced Magnetic Field Testing

FIG. 5 shows various graphs when measuring an external magnetic field in an embodiment of a magnetometer using ODMR according to the present invention:

(a) Plots of the magnetic noise spectral density when on-resonance ($\omega_c=\omega_0$) and off-resonance (($\omega_c\gg\omega_0$)), for both groups A and B with $\Omega$=0.55 MHz, and $\Gamma_p$=0.3 MHz ($P_{in}$=0.4 W). The combined noise floor of the lock-in and detector for the lowest lock-in gain settings, assuming a similar max$\{d_w S_{LI}\}$ to that of A is also plotted. The plots are averaged from five subsequently measured frequency traces and smoothed using a Savitzky-Golay filter. Zoom-in around the peaks designated (i) and (ii) shows un-smoothed data points with the smoothed traces, highlighting the detection and lack of detection of the 50 Hz magnetic noise 'hum' and its $2^{nd}$ odd harmonic when on/off resonance. The difference in amplitude are attributed to varying laboratory conditions.

(b) Plots of the Allan deviation of the traces in (a) using an identical designation. The trend shows dominance by stochastic noise processes such as sinusoidal-noise features (small oscillations as is increased) and shows a drop scaling with $-1/\tau$ highlighting the dominance of white-noise in this regime. A minimum floor for on-resonance detection is reached for $\tau=0.2$-$0.4$ s, which signifies the limitation of electronic voltage noise ('flicker' noise), with further averaging (large $\tau$) giving no advantage. The subsequent increase highlights the dominance of long-term drift through thermal and mechanical based Brownian noise. The larger Allan deviation of group B is related to the fact the maintaining degeneracy is more noisy.

(c) Time trace plot of the on-resonance response of group B to a generated 60 Hz magnetic AC field using the coil. The beating of the 60 Hz noise and the 50 Hz magnetic hum is made clear with the trace, which is a guide for the eye.

Optimisation of the lock-in modulation and excitation rates provides an optimally sensitive magnetic field probe. By setting $\omega_c=\omega_0$ (the point of $\max\{d_w S_{LI}\}$), the presence of magnetic fields results in an immediate voltage shift, with a scaling inversely proportional to $\tau$. Experimental assessment of the resulting sensitivity was carried out through both measuring the magnetic noise spectral density, as well as generating a weak oscillating field close to the diamond, the results of which are summarised in FIG. 5.

Figure 5A:
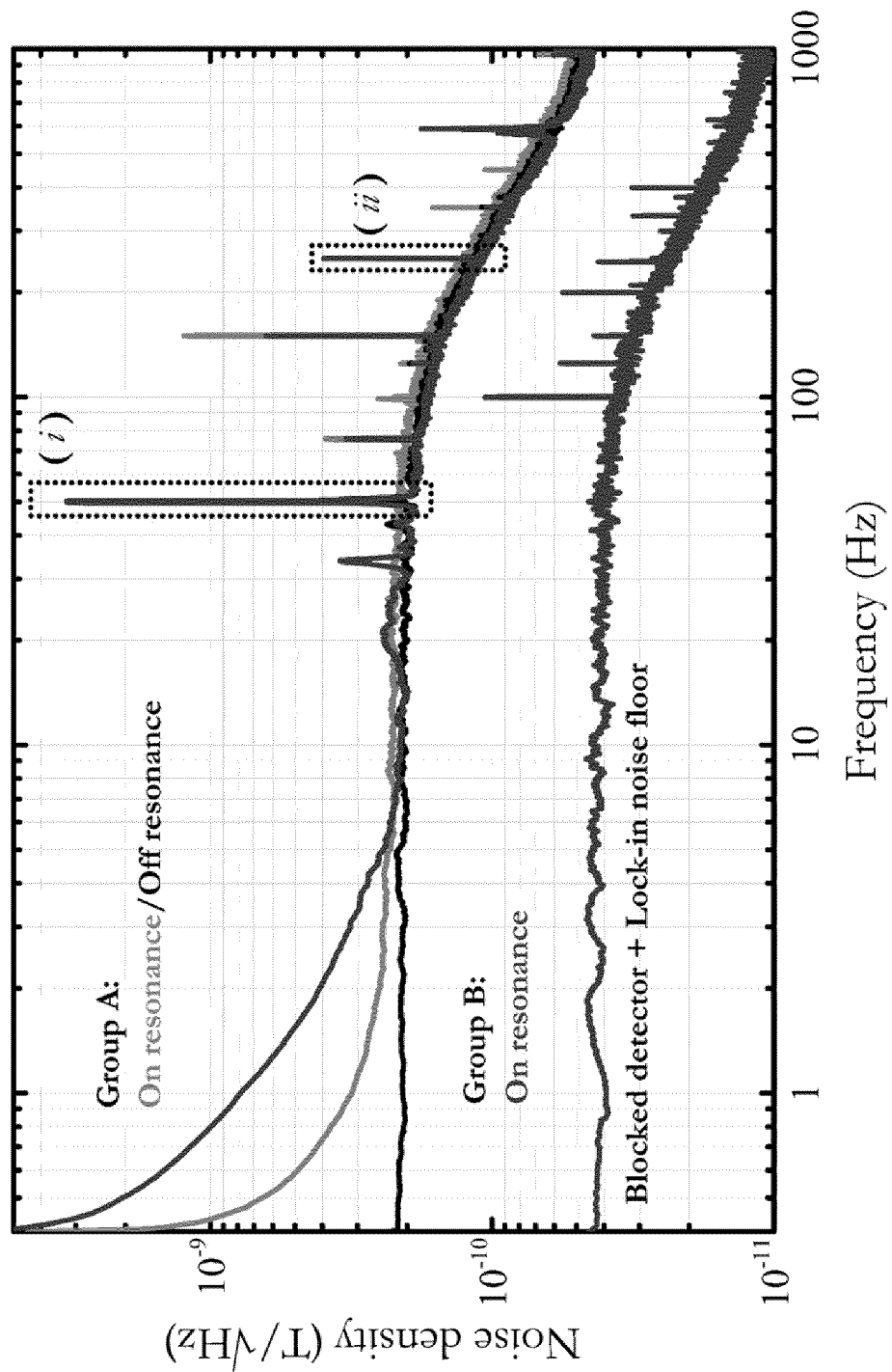
FIG. 5 shows various graphs when measuring an external magnetic field in an embodiment of a magnetometer using ODMR according to the present invention
Figure 5A:
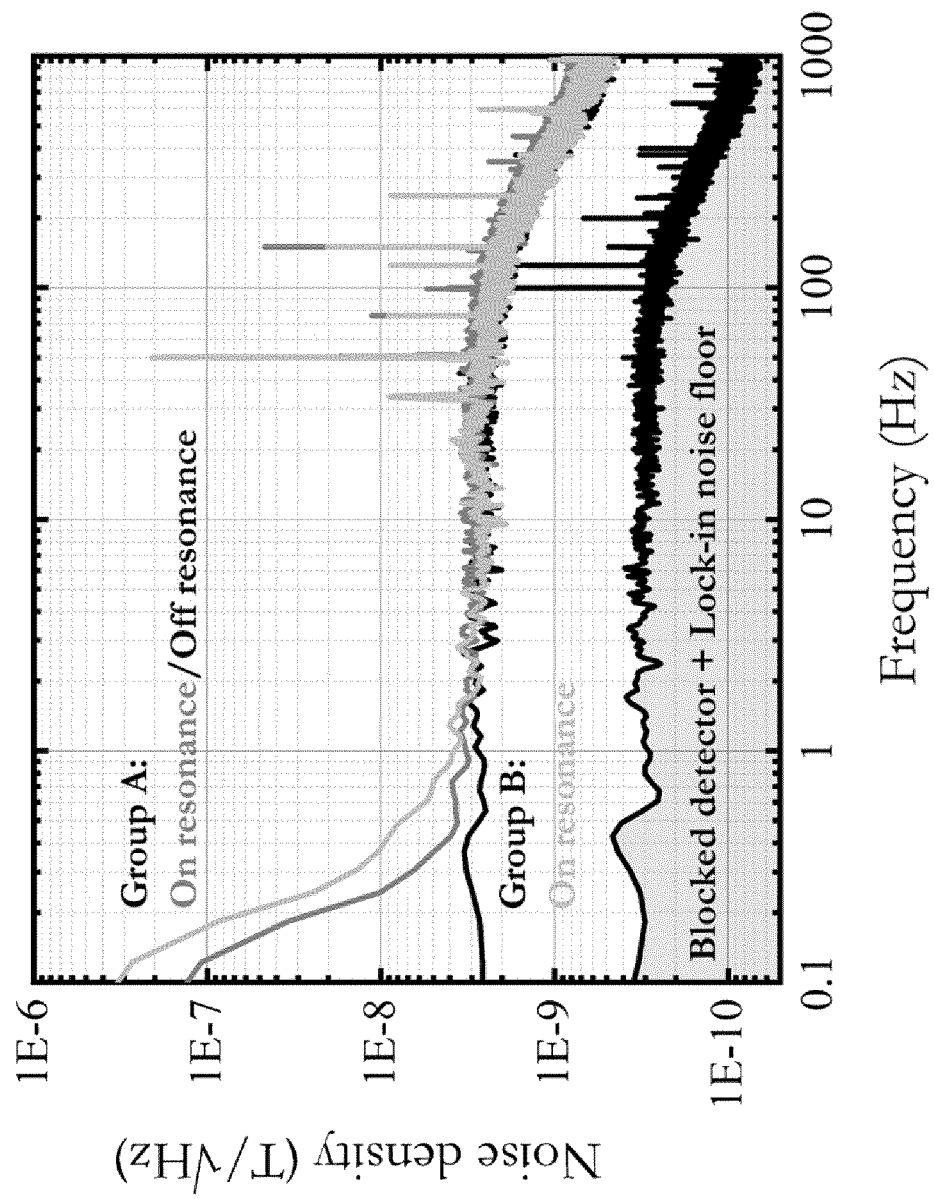
Figure 5B:
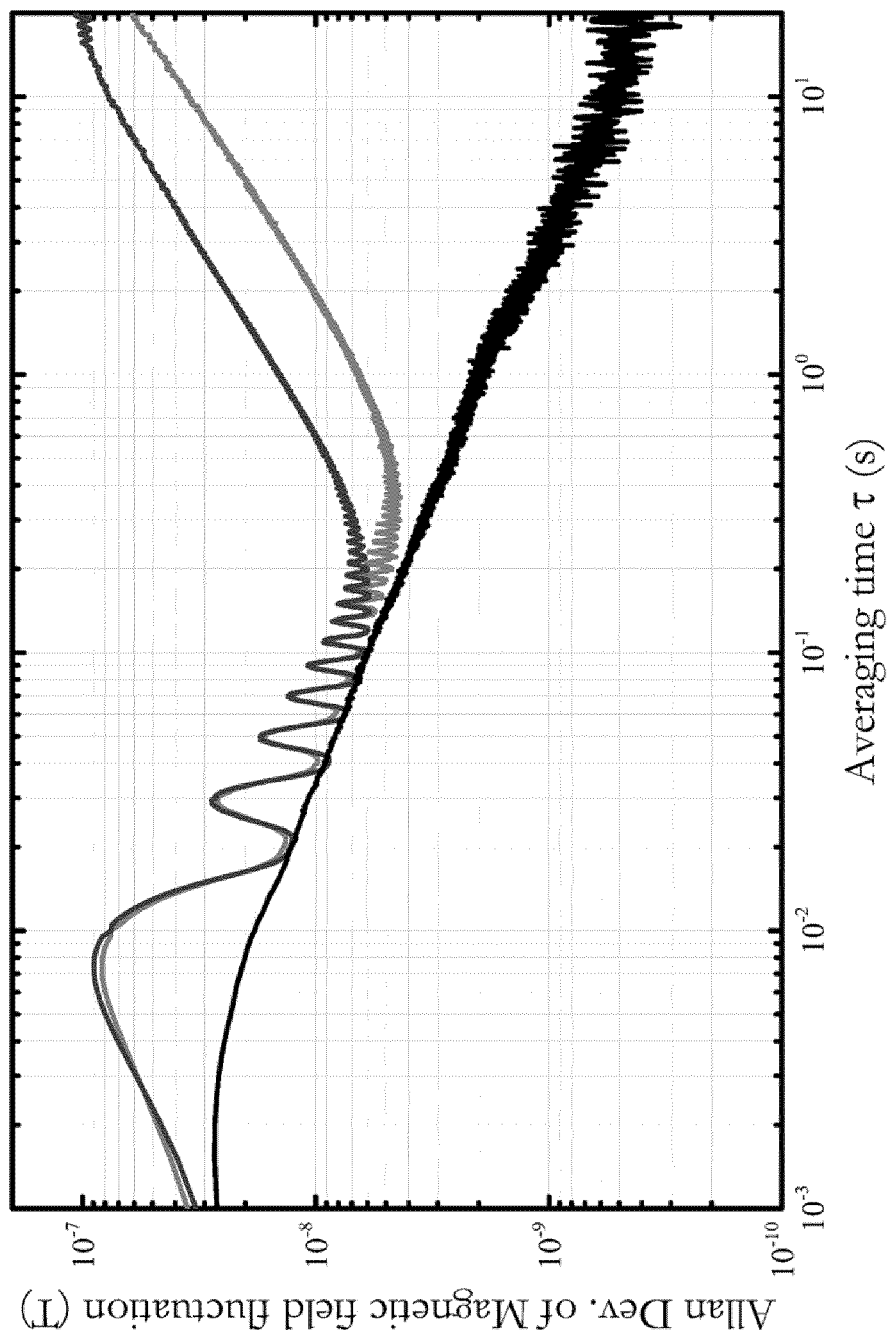
Figure 5C:
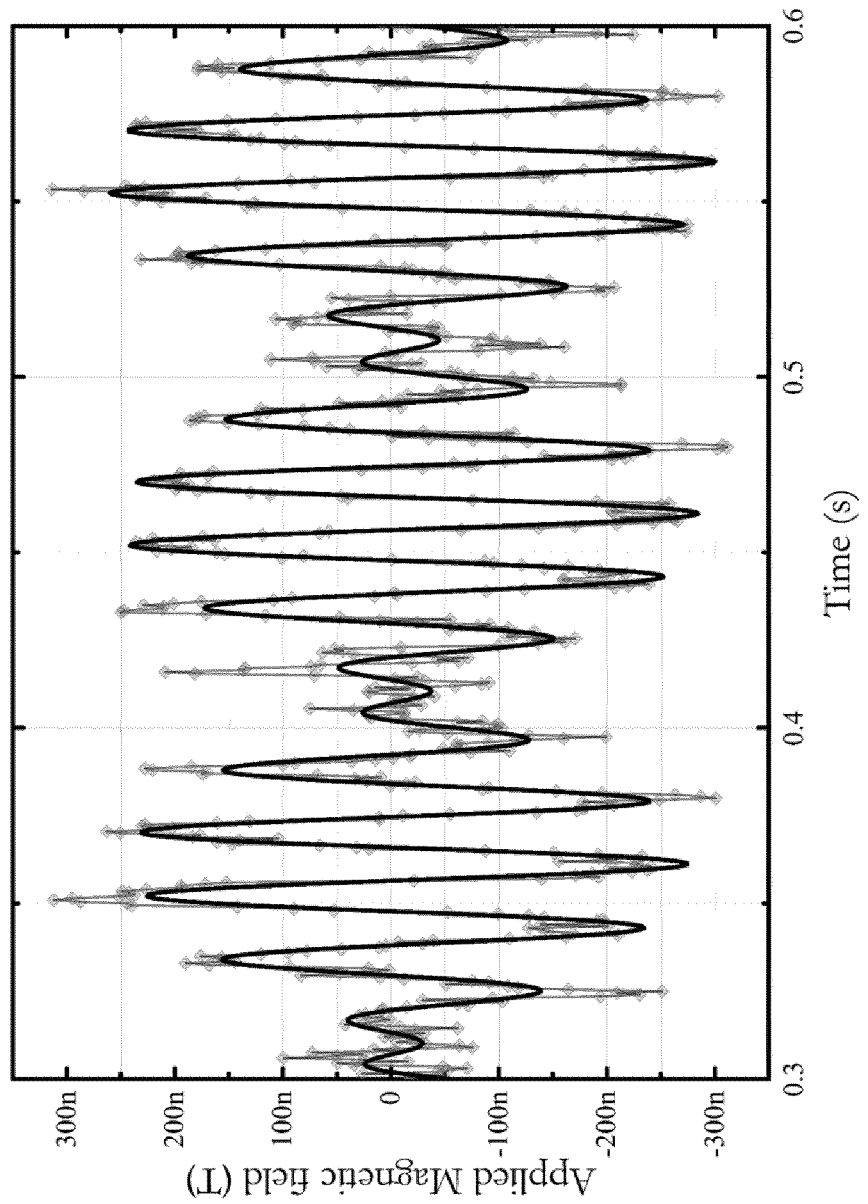

For the measurement of the spectral noise density, both groups A and B were assessed. With $\omega_c=\omega_0$, a time trace of 500 k samples was recorded with a 2 kHz sampling rate, and the resulting sensitivity (T/√(Hz)) scaling of the traces Fourier transform was obtained. This was also carried out for a MW excitation that was off-resonance $\omega_c \gg \omega_0$ in an insensitive part of the spectrum. The resulting spectra in FIG. 5(a) show distinct spectral features resting on a 200 pT/√Hz noise floor for both groups A and B. Given the theoretically anticipated sensitivity calculated above, this value is deemed to be near shot-noise-limited for the current excitation parameters of 0.55 MHz, and $\Gamma_p$ 0.3 MHz ($P_{in}$ 0.4 W). Low frequency (DC −5 Hz) noise is attributed to the slow, temperature-dependent, fluctuating magnetisation of the permanent magnet and to other residual magnetisation of surrounding metallic components. It is also affected by the temperature-dependence of the NV resonance frequency, which has a temperature dependent zero-field splitting adding to the shifted spin resonances $\omega_0$ by a factor of −74.2 kHz/K. Group B is expected to be much more sensitive to such low-frequency magnetic noise due to the three subgroups possessing different relative projection angles, and therefore displays a higher noise density below 5 Hz. Towards higher frequencies, there is a characteristic $1^{st}$ order filter roll-off (−20 dB/decade) which occurs after the cut-off frequency at 159 Hz. Most noteworthy is the detection of the 50 Hz magnetic mains 'hum' and its subsequent odd harmonics, shown to be detectable only when the MW is on resonance.

FIG. 5A' is an updated experiment relative to FIG. 5A i.e. the magnetic noise spectral density when on-resonance ($\omega_c=\omega_0$) and off-resonance (($\omega_c \gg \omega_0$)), for both groups A and B is measured showing a higher level of noise.

Detection of 50 Hz and its $2^{nd}$ odd harmonic for both groups are shown in FIG. 5(a,i,ii) for the measurements of FIG. 5A, subject to the characteristic dampening of the low pass filter. For comparison, the noise spectra generated from the locking amplifier at its lowest gain setting with the connected blocked detector is also plotted, with a similar sensitivity scaling as for group A. This represents the cumulative noise floor limit of the current configuration which may be overcome by further enhancing $\max\{d_w S_{LI}\}$ (i.e. via changing the linewidth/contrast ratio) and increasing the light collection efficiency.

Further investigation of the systems noise characteristics was carried out by calculating the Allan deviation of the time traces. These are plotted in FIG. 5(b) for the same traces used in FIG. 5(a) (same designation) in units of T. The so-called Allan deviation is a measure of the standard deviation as a function of sample binning size, and is commonly used in this field, in conjunction with the spectral noise density, to study and identify the presence of systematic and stochastic noise in oscillatory systems. The slopes and features of the obtained trend highlight the type of noise present and their limits on the optimal averaging time. In the calculated Allan plots, the most striking feature is the clear difference in behaviour between the on- and off-resonance traces. The off-resonance traces exhibits a constant $1/\tau^{-1/2}$ scaling which signifies the dominance of stochastic white-noise, as expected from thermally induced electronic noise generated in the detector and lock-in amplifier components. Both on-resonance traces also show the same trend dressed with the systematic noise originating from the 50 Hz hum, but reach a slightly different minimum of 4 nT at 0.4 and 6 nT at 0.2 s, for A and B, respectively. Group B displays a higher Allan deviation at a slightly shorter time-scale, believed to be due to the increased sensitivity of three groups maintaining degeneracy, and the larger intrinsic magnetic noise inherent to the denser ensemble of group B compared to group A. For longer averaging times, the minima are followed by an increase with a scaling that signifies the onset of long term thermal drift, originating from e.g. temperature-based magnetisation fluctuation and thermal expansion and displacement of surrounding metallic fixtures. Finally, a weak external AC magnetic field $B\_E$ was applied to test the system response to more realistic measurement scenarios. A 60 Hz sine field is generated using the coil placed nearby the diamond holder, and a time trace is measured for group B, using all the same measurement parameters applied for measuring the magnetic spectral noise density in FIG. 5(a). A portion of a recorded 250 second time trace is plotted in FIG. 5(c), which distinctly highlights beating between the generated 60 Hz field and the 50 Hz magnetic hum. Bearing in mind the Allan deviation characteristics of the magnetometer shown in FIG. 5(b), estimating a single standard deviation of the measured trace would only be fair in the presence of a at spectrum when white-noise dominates. Instead, an Allan deviation of 6 nT is obtained for a sampling bin of 0.2 seconds from the total 250 second trace (a portion of which is shown FIG. 5(c)). Accounting for the sampling bin bandwidth, a directly extracted sensitivity of 3 nT/√Hz is calculated. This value is larger then the measured noise density floor due to the presence of the low frequency magnetic noise fluctuations from the environment and the magnetic coil itself. Through shielding of the environment and stabilisation of the current source in the magnetic coil, this measured value is expected to approach the noise floor of 200 pT/√Hz.

Figure 5D:
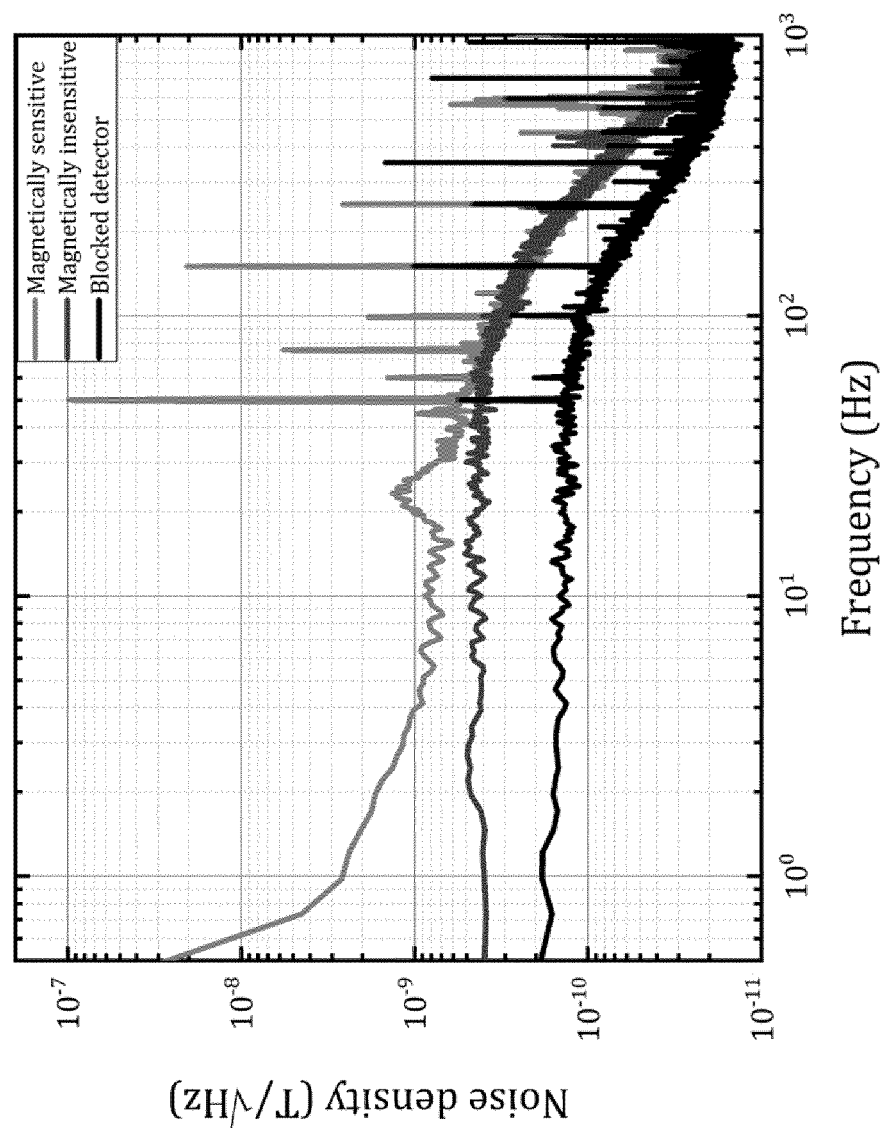

FIG. 5D shows noise density from the measurements shown in FIG. 5A' but with another measurement setup, which could further reduce the technical noise to a large extend by using common mode rejection, i.e. taking the signal difference between the second fluorescence detector 65 and the first detector 60 measuring the laser irradiation, e.g. the green light, transmitted through the optical cavity. In addition, there was also used a larger photo diode as the second detector 65 for the fluorescence light detection in order to increase the photo current.

Summarizing, the present invention shows how amplifying the pump field in combination with a microwave resonator antenna and lock-in detection can reach a near-shot-noise-limited noise floor using an off-the-shelf CVD diamond with no additional modification, and unoptimised fluorescence collection. The use of the confocal cavity brought about excitation across a volume of $3.5 \times 10^{-2}$ mm$^3$, with an estimated number of $10^9$ NVs, allowing for a nonlinear fluorescence excitation regime to be reached. This was crucial for bringing about linewidth-narrowing and thereby maximising the measured lock-in slope, in combination with simultaneously exciting all three hyperfine frequencies. The enhanced sensitivity of the signal allowed for the measurement of a 200 pT/√Hz noise floor for frequencies ranging from 0.1 Hz to 159 Hz (limited by the time constant set by the lock-in amplifier), and the measurement of an applied 60 Hz magnetic field with an extracted sensitivity of 3 nT/√Hz which is limited by the environmental magnetic noise. Compared to the projected calculated sensitivity of 160 pT/√Hz achievable with the estimated number of NVs, the measured noise floor is assumed to be near-shot-noise-limited. The invention shows the importance of enhancing the efficiency and uniformity of excitation and spin polarisation, with measured DC sensitivities comparable to those reported in the literature that are based on using denser NV ensembles. Furthermore, it indicates that an increased ensemble density may necessitate significantly larger excitation powers to optimise their collective sensitivity. This indicates that the needed power for ensembles that are orders of magnitude denser may be impractical from an application point of view, assuming NV absorption is the dominant absorption source.

FIG. 6 shows various views of a crystal diamond 10 in another embodiment of a magnetometer using ODMR according to the present invention.

Figure 6A:
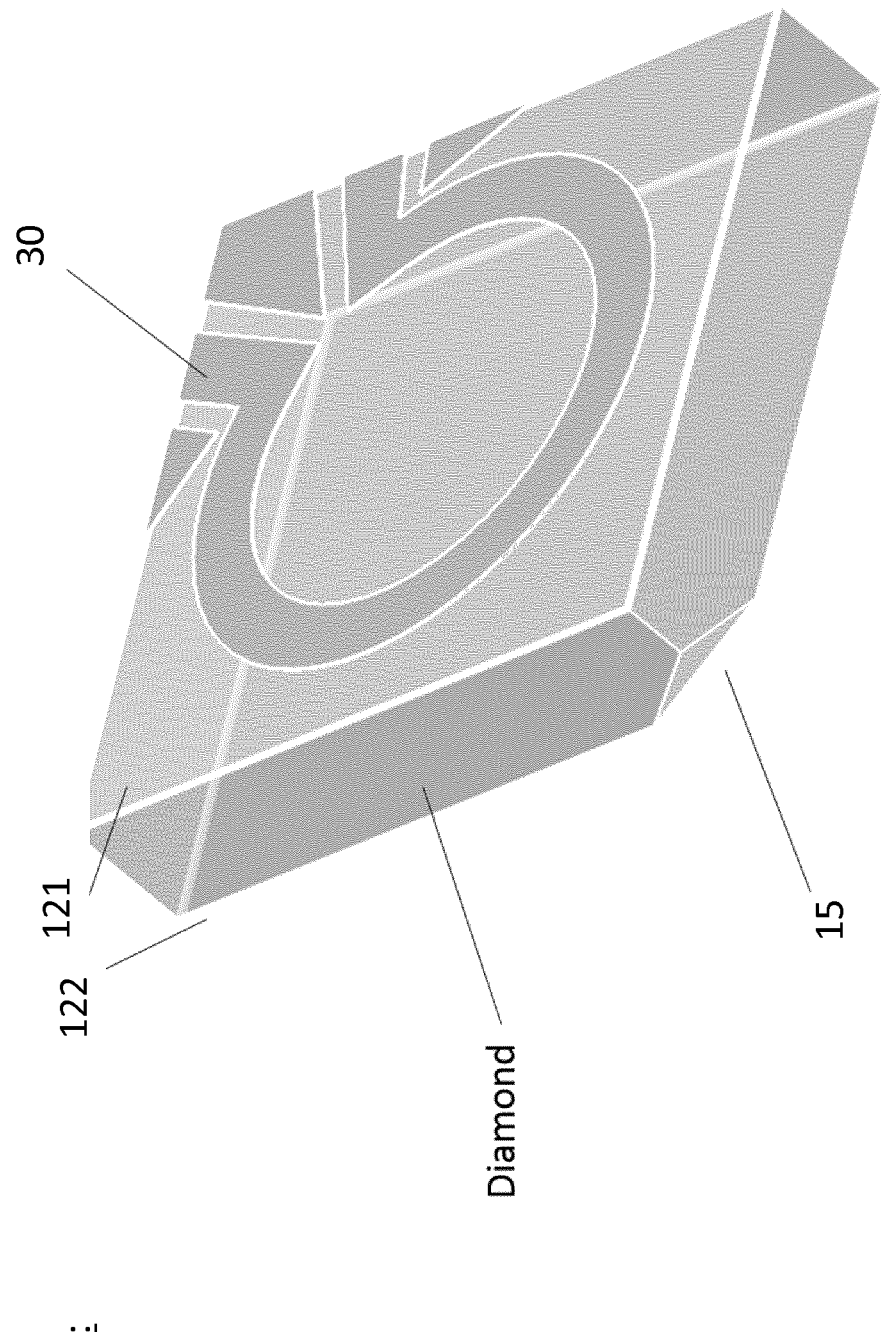
FIG. 6 shows various views of a crystal diamond in another embodiment of a magnetometer using ODMR according to the present invention.

FIG. 6A is perspective view showing the relatively flat and quadratic shape of the diamond where the diamond has three-dimensional cut-corner 15, said cut-corner having a geometry where the corner is truncated with a facet as illustrated. From geometry, a facet is generally with a degree of freedom less than the original structure, it can have a uniform or non-uniform shape. Beneficially, the second optical detector 65 (not shown but see FIG. 1B) is optically configured for detecting fluorescence 27 from the solid state material, e.g. diamond, through said cut-corner 15 in the solid state material. Thus collecting the light through a cut corner is feasible. This avoids to a large extend total internal reflection on the diamond surfaces and improves the light collection efficiency compared to collection through the large planar surface. The cut-corner 15 is also shown in FIGS. 6B and 6C.

The mirrors 121 and 122 on both sides may be double Bragg reflection mirror DBR and the microwave antenna 30 deposited on the low reflected DBR accommodates for laser transmission, though an opposite configuration can also be used with the microwave antenna on the high reflected DBR. An optical cavity is then formed by two DBR mirrors deposited on the diamond surface with unequal reflectivity like in FIG. 1B, ensuring that the full resonant mode occurs within the diamond 10. To increase the finesse F of the cavity, one side may form a curvature, which can be readily made using focused ion-beam milling.

Figure 6B:
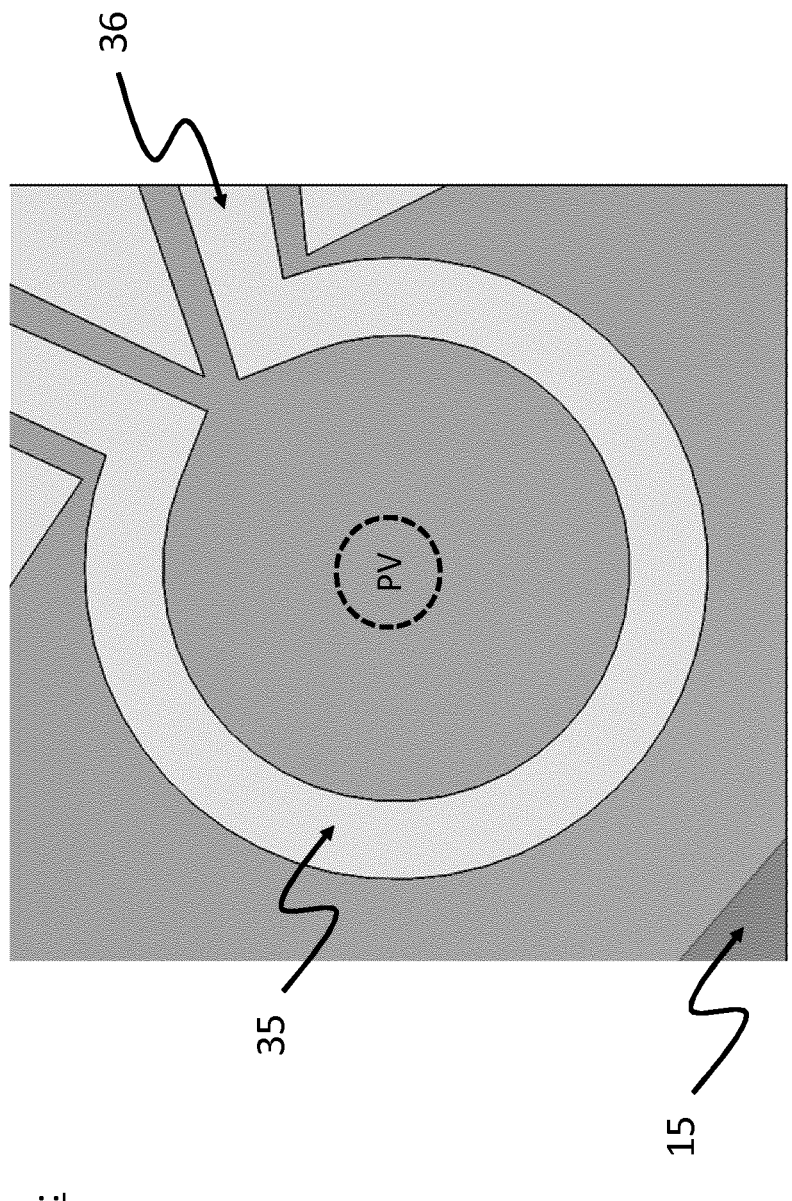

As seen in FIGS. 6A and 6B, the coupling structure 30 has a portion of the structure in physical contact with the diamond, thus it may be deposited on the diamond surface. The coupling structure 30 has least a portion of the structure with a ring-like symmetric structure, said probe volume PV being substantially positioned within the center of the ring-like symmetry of the coupling structure with respect to the laser irradiation 26 going through the relatively flat laser sample 10 as shown in the cross-sectional view in FIG. 6C. In FIG. 6B, the laser irradiation enters in the direction into the paper, preferably at an orthogonal angle with the diamond sample.

Figure 6C:
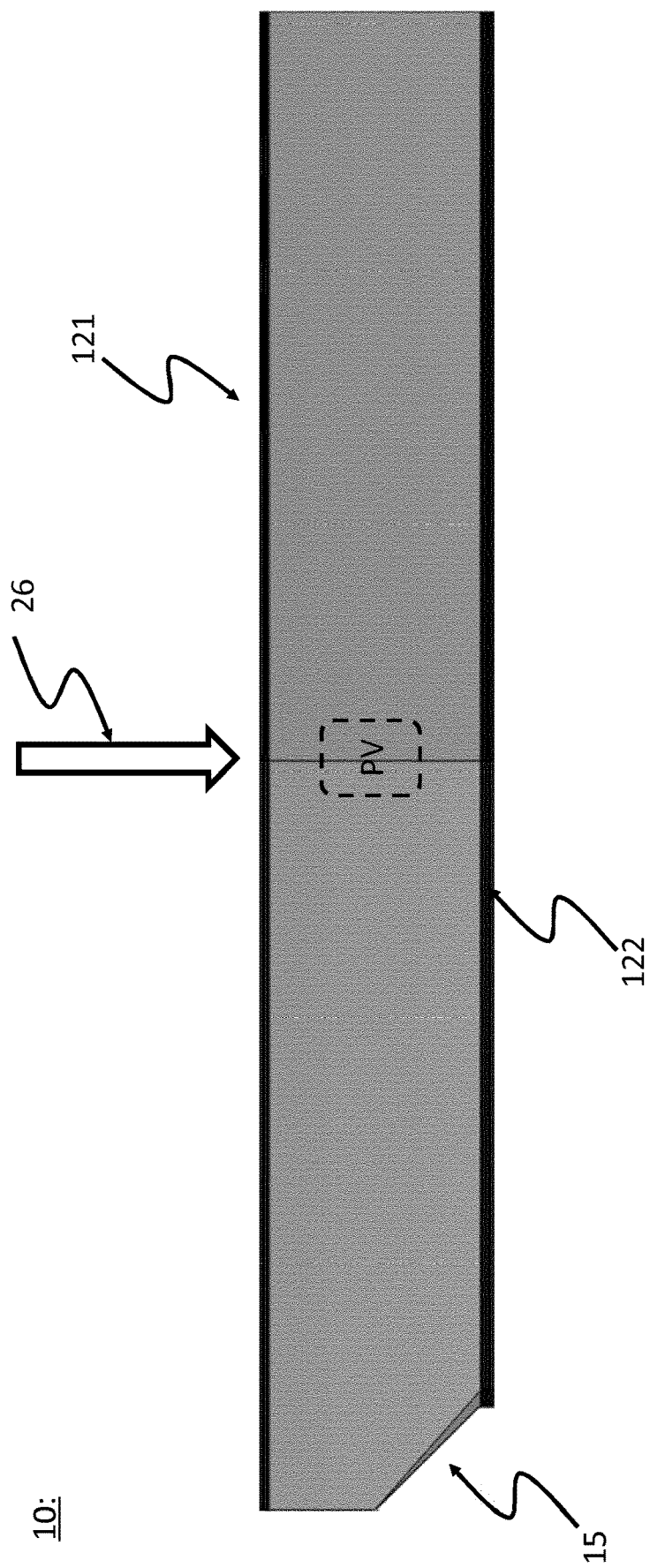

As also illustrated in FIGS. 6A and 6C the optical cavity 20 surrounding the solid state material 10 is integrated in the solid state material by manufacturing at least two mirrors 121 and 122 on opposing sides of the solid state material. The irradiation 26 is preferably entering the diamond at a central position as indicated by the probe volume PV in FIG. 6C, the irradiation is preferably entering substantially orthogonal to the surface of the diamond. The mirrors can be manufactured in TiO, glass, SiO$_2$ or other appropriate coating materials for mirrors, and any combinations thereof.

Figure 6D:
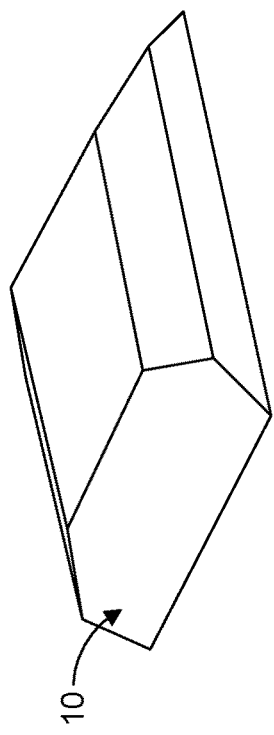
Figure 6D:
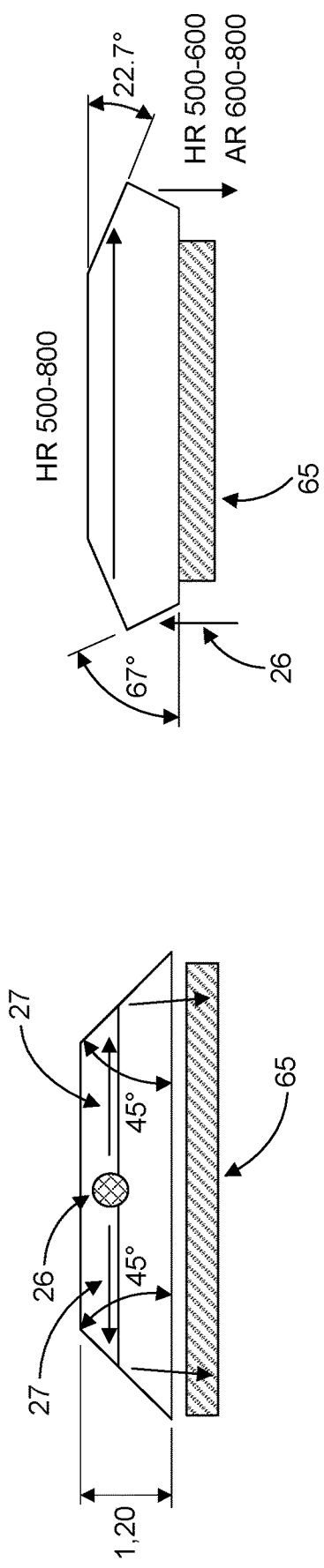

FIG. 6D shows another variant of the solid state material 10 for use in the magnetometer according to the present invention. In the upper perspective drawing, the diamond 10 has Brewster angle cuts and other cuts to get the laser irradiation pump efficiently into the sample and have it propagate parallel to the surface and couple out again. In the two cross-sectional views of the diamond below, the optical path for the laser irradiation 26 is schematically illustrated. The sample is 45 degree cut to reflect more emission light 27 e.g. fluorescence light towards the photo detector 65 (i.e. the second detector from FIG. 1B) attached directly to the diamond 10 in this embodiment. The second photo detector 65 is the square underneath the diamond 10. The antenna board or coupling structure (not shown here) may be placed on top of the diamond 10. The diamond sample may also be coated with appropriate high reflective (HR) and anti-reflective (AR) layers as indicated in the right cross-sectional drawing.

Figure 7:
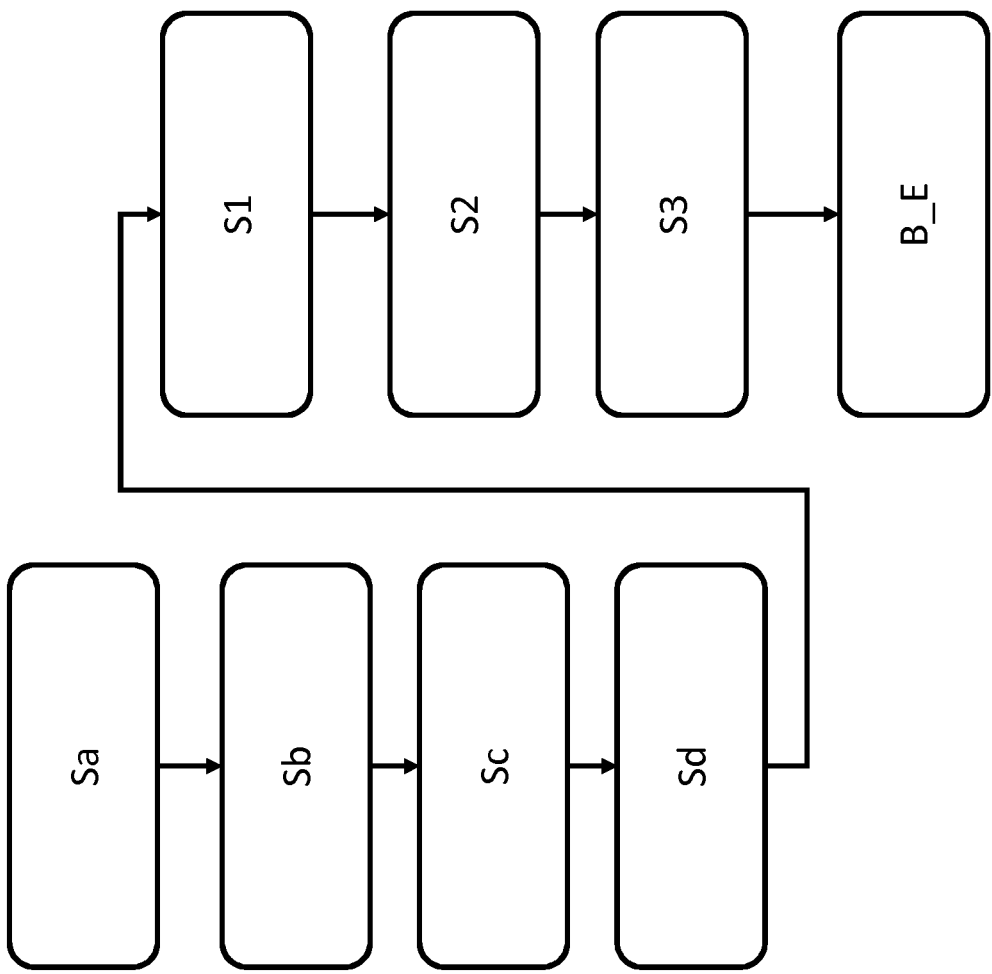
FIG. 7 is a schematic system-chart representing an outline of a method according to the invention.

FIG. 7 is a schematic system-chart representing an outline of a method according to the invention. The method for measuring an external magnetic field B_E using optically detected magnetic resonance (ODMR), comprising the steps of:

Sa providing a solid state material 10 comprising an ensemble of paramagnetic defects, the paramagnetic defects being optically active, Sb arranging an optical cavity 20 for surrounding the solid state material, the optical cavity being optically excitable $\Gamma_P$ by an irradiation laser 25 arranged therefore, Sc providing a coupling structure 30 being arranged for electromagnetic coupling to said solid state material, the coupling structure being arranged for substantially homogenous radio frequency and/or microwave excitation Ω of the paramagnetic defects, cf. FIGS. 1B and 6, and Sd providing a substantially constant, directional magnetic field B_C from a magnetic source 40 close to the said solid state material, said constant directional magnetic field being sufficient to cause a Zeeman splitting of the energy levels in said paramagnetic defects, wherein a probing volume PV in the solid state material is defined by the spatially overlapping volume of:

S1 performing the excitation of the paramagnetic defects by the irradiation laser 25, S2 arranging the coupling structure 30 for exciting the same paramagnetic defects defined in step S1, and S3 providing the constant directional magnetic field B_C, and wherein the method performs a measurement of the external magnetic field B_E by detecting emission 27 from the paramagnetic defects in the probing volume PV, cf. FIG. 6, by utilising the double excitation of the said excitation of the paramagnetic defects by the irradiation laser, and the said coupling structure exciting the same paramagnetic defects, cf. FIG. 1B.

Summarizing, the present invention relates to a magnetometer 100 using optically detected magnetic resonance (ODMR), cf. FIG. 2, where a solid state material 10, such as diamond, with an ensemble of paramagnetic defects, such as nitrogen vacancies centers NV, is applied. An optical cavity 20 is optically excited by an irradiation laser 25 arranged therefore. A coupling structure 30 causes a microwave excitation Ω of the paramagnetic defects, and a permanent magnetic field 40, B_C causes a Zeeman splitting of the energy levels in paramagnetic defects. A probing volume PV in the solid state material is thereby defined by the spatially overlapping volume of the optical excitation by the irradiation laser 25, the coupling structure 30 also exciting the defects, and the constant directional magnetic field B_C. The magnetometer measures an unknown magnetic field by detecting emission 27, e.g. fluorescence, from the defects in the probing volume PV from the double excitation of the defects by the irradiation laser, and the coupling structure exciting the same defects.

The invention can be implemented by means of hardware, software, firmware or any combination of these. The invention or some of the features thereof can also be implemented as software running on one or more data processors and/or digital signal processors.

The individual elements of an embodiment of the invention may be physically, functionally and logically implemented in any suitable way such as in a single unit, in a plurality of units or as part of separate functional units. The invention may be implemented in a single unit, or be both physically and functionally distributed between different units and processors.

Although the present invention has been described in connection with the specified embodiments, it should not be construed as being in any way limited to the presented examples. The scope of the present invention is to be interpreted in the light of the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A magnetometer for measuring an unknown external magnetic field (B_E) using optically detected magnetic resonance (ODMR), comprising:
    a) a solid state material comprising an ensemble of paramagnetic defects, the paramagnetic defects being optically active,
    b) an optical cavity surrounding the solid state material, the optical cavity being optically excited ($\Gamma_P$) by an irradiation laser arranged therefore, wherein the optical cavity comprises as least two reflecting mirrors or reflecting surfaces,
    c) a coupling structure, which is an antenna or a waveguide, being arranged for electromagnetic coupling to said solid state material, the coupling structure being arranged for providing substantially homogenous, radio frequency and/or microwave, excitation (Ω) of the paramagnetic defects, and
    d) a magnetic source providing a substantially constant, directional magnetic field (B_C) within said solid state material, said constant directional magnetic field being sufficient to cause a Zeeman splitting of the energy levels in said paramagnetic defects,
    wherein a probing volume (PV) in the solid state material is defined by the spatially overlapping volume of:
    1) the excitation of the paramagnetic defects by the irradiation laser,
    2) the coupling structure exciting the same paramagnetic defects defined in step 1), and
    3) the constant directional magnetic field (B_C), and
    wherein the magnetometer is configured to measure the external magnetic field (B_E) by detecting emission from the paramagnetic defects in the probing volume (PV) by utilizing the double excitation of said excitation of the paramagnetic defects by the irradiation laser, and said coupling structure exciting the same paramagnetic defects.

2. The magnetometer according to claim 1, wherein the optical cavity surrounding the solid state material comprises at least two mirrors, and wherein the magnetometer comprises:
    a first optical detector being optically connected to the optical cavity and arranged for providing a signal output to a feedback mechanism for adjusting the said optical cavity, by actuating or otherwise change the optical properties of one, or more, of the at least two mirrors, and/or
    a second optical detector being optically configured for detecting emission from the solid state material.

3. The magnetometer according to claim 2, wherein the second optical detector is optically arranged for receiving emission from the said paramagnetic defects, said emission having an optical path towards the second optical detector, which is different from an optical path defined by radiation in the optical cavity from the irradiation laser.

4. The magnetometer according to claim 3, wherein the magnetometer is configured to reduce noise by applying a difference between an output from the first detector and an output from the second detector and using a common mode rejection ratio (CMRR) on said difference.

5. The magnetometer according to claim 1, wherein the solid state material comprises at least one two-dimensional or three-dimensional cut-corner said cut-corner having a geometry where the corner is truncated with a facet.

6. The magnetometer according to claim 5, wherein the second optical detector is optically configured for detecting said emission from the solid state material through said cut-corner in the solid state material.

7. The magnetometer according to claim 1, wherein said coupling structure has at least a portion of the structure in physical contact with the solid state material.

8. The magnetometer according to claim 1, wherein said coupling structure has at least a portion of the structure with a ring-like symmetry.

9. The magnetometer according to claim 1, wherein the optical cavity surrounding the solid state material is integrated in the solid state material by manufacturing at least two mirrors on opposing sides of the solid state material.

10. The magnetometer according to claim 1, wherein the optical cavity surrounding the solid state material has a maximum cumulative round trip loss product in the cavity, ρ, of 20, 10, or 5%.

11. The magnetometer according to claim 1, wherein the irradiation laser is configured to be substantially resonant with the optical cavity.

12. The magnetometer according to claim 1, wherein the optical cavity is substantially impedance matched with the irradiation laser.

13. The magnetometer according to claim 12, wherein said impedance matching is performed by levelling an incoupling mirror as being substantially equal to the cumulative round trip loss product in the cavity by configuring the magnetometer according to the approximate relation:

$$P_{cav} = P_{laser} T_1 / (1-\rho)^2,$$

where $T_1$ is the transmission of an incoupling mirror, ρ is the cumulative round trip loss product in the cavity, $P_{laser}$ is the power of the irradiation laser, and $P_{cav}$ is the intra-cavity power.

14. The magnetometer according to claim 1, wherein the irradiation laser is configured for being emitted as a continuous-wave when measuring the external magnetic field (B_E).

15. The magnetometer according to claim 1, wherein constant directional magnetic field (B_C) is directed substantially along a quantization axis of the defects.

16. The magnetometer according to claim 1, wherein the solid state material is a single crystal diamond, and the paramagnetic defects are nitrogen vacancies centers (NV), with impurities levels of NV being maximum 5 ppb.

17. The magnetometer according to claim 1, wherein the magnetometer is arranged for having a sensitivity of maximum 300 pT/(Hz)^½ when measuring an external magnetic field (B_E).

18. A method for measuring an external magnetic field (B_E) using optically detected magnetic resonance (ODMR), comprising:
   a) providing a solid state material comprising an ensemble of paramagnetic defects, the paramagnetic defects being optically active,
   b) arranging an optical cavity for surrounding the solid state material, the optical cavity being optically excited (FP) by an irradiation laser arranged therefore, the optical cavity comprises as least two reflecting mirrors or reflecting surfaces,
   c) providing a coupling structure, which is an antenna or a waveguide, being arranged for electromagnetic coupling to said solid state material, the coupling structure being arranged for providing substantially homogenous, radio frequency and/or microwave, excitation (Ω) of the paramagnetic defects, and
   d) providing a substantially constant, directional magnetic field (B_C) from a magnetic source close to said solid state material, said constant directional magnetic field being sufficient to cause a Zeeman splitting of the energy levels in said paramagnetic defects,
wherein a probing volume (PV) in the solid state material is defined by the spatially overlapping volume of:
   1) performing the excitation of the paramagnetic defects by the irradiation laser,
   2) arranging the coupling structure for exciting the same paramagnetic defects defined in step 1), and
   3) providing the constant directional magnetic field (B_C), and
wherein the method performs a measurement of the external magnetic field (B_E) by detecting emission from the paramagnetic defects in the probing volume (PV) by utilizing the double excitation of said excitation of the paramagnetic defects by the irradiation laser, and said coupling structure exciting the same paramagnetic defects.

* * * * *